(12) United States Patent
Iino et al.

(10) Patent No.: US 6,252,333 B1
(45) Date of Patent: *Jun. 26, 2001

(54) STAGE UTILIZING ULTRASONIC MOTOR AND ELECTRONIC EQUIPMENT AND PRINTER UTILIZING THE STAGE

(75) Inventors: Akihiro Iino; Masao Kasuga, both of Chiba (JP)

(73) Assignee: Seiko Instruments Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,501

(22) Filed: Feb. 19, 1999

(30) Foreign Application Priority Data

Feb. 20, 1998 (JP) .................................................. 10-039408
Mar. 19, 1998 (JP) .................................................. 10-070997

(51) Int. Cl.⁷ ........................................................ H02N 2/00
(52) U.S. Cl. ................................. 310/323.17; 310/328
(58) Field of Search ............................... 310/323.17, 328

(56) References Cited

U.S. PATENT DOCUMENTS

| | | | |
|---|---|---|---|
| 4,422,002 | * 12/1983 | Bining et al. | ............ 310/328 |
| 4,785,177 | * 11/1988 | Besocke | ............ 310/328 |
| 4,928,030 | * 5/1990 | Culp | ............ 310/328 |
| 5,229,601 | * 7/1993 | Guern et al. | ............ 250/221 |
| 5,506,462 | * 4/1996 | Tamai et al. | ............ 310/328 |
| 5,886,455 | * 3/1999 | Tsukimoto | ............ 310/323 |

FOREIGN PATENT DOCUMENTS

| 0253375 | 1/1988 | (EP) | ............ H01L/4/08 |
|---|---|---|---|
| 1-303361 | * 12/1989 | (JP) | ............ 310/328 |

OTHER PUBLICATIONS

Patent Abstracts of Japan, Camm, 0425901S, Sep. 1992.

* cited by examiner

Primary Examiner—Thomas M. Dougherty
(74) Attorney, Agent, or Firm—Adams & Wilks

(57) ABSTRACT

A stage comprises a first moving body mounted on a support base for movement in a first direction (e.g., X direction) relative to the support base. A second moving body is mounted on the first moving body for movement in the first direction and in a second direction (e.g., Y direction) relative to the support base and the first moving body. A first piezoelectric actuator is in contact with the first moving body for moving the first moving body in the first direction. A second piezoelectric actuator is in contact with the second moving body for moving the second moving body in the second direction.

29 Claims, 13 Drawing Sheets

Fig. 13A

| MOVING DIRECTION \ APPLYING SIGNAL | 8 1 a | 8 1 b | 8 1 c | 8 1 d |
|---|---|---|---|---|
| 3 1 5° ↘ | V 0 | | | |
| 2 2 5° ↙ | | V 0 | | |
| 1 3 5° ↘ | | | V 0 | |
| 4 5° ↗ | | | | V 0 |
| 0° → | V 0 | | | V 0 |
| 1 8 0° ← | | V 0 | V 0 | |
| 9 0° ↑ | | | V 0 | V 0 |
| 2 7 0° ↓ | V 0 | V 0 | | |

Fig. 13B

| MOVING DIRECTION / APPLYING SIGNAL | 8 1 a | 8 1 b | 8 1 c | 8 1 d |
|---|---|---|---|---|
| C W ↺ | V 0<br>(−V 1)<br>(−V 0)<br>V 1 | V 1<br>V 0<br>(−V 1)<br>(−V 0) | (−V 0)<br>V 1<br>V 0<br>(−V 1) | (−V 1)<br>(−V 0)<br>V 1<br>V 0 |
| C C W ↺ | V 1<br>(−V 0)<br>(−V 1)<br>V 0 | V 0<br>V 1<br>(−V 0)<br>(−V 1) | (−V 1)<br>V 0<br>V 1<br>(−V 0) | (−V 0)<br>(−V 1)<br>V 0<br>V 1 |

STAGE UTILIZING ULTRASONIC MOTOR AND ELECTRONIC EQUIPMENT AND PRINTER UTILIZING THE STAGE

BACKGROUND OF THE INVENTION

The present invention relates to a stage utilizing a piezoelectric actuator or ultrasonic motor movable on a two-dimensional plane and electronic equipment and a printer utilizing the stage.

Recently, an X-Y stage having single axis ables overlapped in the vertical direction at a crossing angle of 90° to each other is often used to measure and process two-dimensional objects.

It is common to employ a method in which the rotation of an electromagnetic motor is converted into a linear motion with a feed screw in each of X- and Y-directions or a method in which linear driving is performed with an electromagnetic linear motor in each of the X- and Y-directions (refer to JSPE-57-10, '91-10-1726).

In the case of the method in which motors and feed screws are combined, however, positioning accuracy is reduced by back-lash at the screw portions or thermal expansion of the screw portions. Further, the mechanism becomes complicated and large because the screw portions must be provided such that they cover the entire amount of desired feed.

In the case of an electromagnetic linear motor, positioning accuracy is limited by the relationship between the poles of the permanent magnet and the coil for generating a magnetic field. Specifically, the coil tends to stop in the vicinity of a pole of the permanent magnet and, as a result, it is difficult to stop the X-Y stage at an intended position. Further, the coil or permanent magnet must be provided such that it covers the entire amount of desired feed, which makes the mechanism complicated and large.

The above-described methods also have had a problem in that they are not usable in an environment where magnetization is avoided because components around the stage are magnetized by an electromagnetic force and circuits round the stage are susceptible to electromagnetic noises.

Meanwhile, ultrasonic motors utilizing a piezoelectric effect of a piezoelectric element are attracting attention in the field of micro-motors. Especially, ultrasonic motors utilizing an oscillator which undergoes stretching oscillation and bending oscillation (duel mode oscillator) are used in various applications because they cause a linear motion, a rotary motion and the like at an object with composite oscillation which is a synthesis of the two kinds of oscillation (see Japanese unexamined patent publication No. H7-184382).

SUMMARY OF THE INVENTION

It is an object to provide a stage utilizing an ultrasonic motor with which positioning accuracy can be improved, which has a simple and compact mechanism and which can be used in an environment where magnetization is avoided and electronic equipment and a printer utilizing the same.

Specifically, as set forth in claim 1, means for solving the above-described problems is a stage including a first moving body which is movable in one direction and a second moving body which moves in one direction with said first moving body and which is movable in another direction different from said one direction, characterized in that it comprises:

a first piezoelectric actuator or ultrasonic motor which is put in contact with said first moving body for moving the moving body in said one direction and a second piezoelectric actuator or ultrasonic motor which is put in contact with said second moving body for moving the moving body in said other direction.

In the above-described solving means, the piezoelectric actuator or ultrasonic motor comprises any of a method wherein elliptical oscillation is obtained in a position between an antinode and a node of bending oscillatory wave, a method wherein a progressive wave in generated by a first bending oscillatory wave and a second bending oscillatory wave, a method wherein elliptical oscillation is obtained from a stretching oscillatory wave and a bending oscillatory wave and a method wherein elliptical oscillation is obtained from a stretching oscillatory wave and a torsional oscillatory wave.

Materials for a piezoelectric element used in the piezoelectric actuator or ultrasonic motor include barium titanate., lead titanate zirconate, lithium niobate and lithium tantalate.

Further, each moving body may be moved by a single or a plurality of piezoelectric actuator or ultrasonic motor. While the one direction and the other direction may be selected appropriately, the one direction and the other direction are preferably orthogonal to each other to move the second moving body efficiently.

According to the above, the first piezoelectric actuator or ultrasonic motor is put in contact with the first moving body for applying a frictional force in one direction to move the first moving body in the one direction, and the second moving body is also moved as the first moving body is moved.

The second piezoelectric actuator or ultrasonic motor is put in contact with the second moving body for applying a frictional force in another direction to move the second moving body in the other direction. The second moving body freely moves a plane comprising the one direction and the other direction.

That is, since each of the piezoelectric actuators or ultrasonic motors is put in contact with a moving body to apply a frictional force thereto directly, there is no need for providing a mechanism for transmitting a driving force between the moving body and an oscillator and, therefore, the configuration of the apparatus is made simple and compact. Further, there is neither back-lash nor errors associated with the provision of a mechanism for transmitting a driving force.

Since the piezoelectric actuators and ultrasonic motors are not stopped in any particular position by factors such as a magnetic force unlike electromagnetic motors, the positioning accuracy of the moving bodies is improved.

In addition, since no electromagnetic noise is generated, it may be used in an environment where magnetization is avoided.

As set forth in claim 2, there is provided a stage utilizing a piezoelectric actuator or ultrasonic motor according to claim 1, characterized in that it comprises a first urging mechanism for urging said first piezoelectric actuator or ultrasonic motor against said first moving body and a second urging mechanism for urging said second piezoelectric actuator or ultrasonic motor against said second moving body.

In the above-described means, the urging mechanism comprises urging means utilizing an elastic member. The elastic member comprises a coil spring, flat spring, a spring of other kind, rubber or the like.

According to the above, the first urging mechanism urges the first piezoelectric actuator or ultrasonic actuator against the first moving body to generate an adequate frictional force between the first piezoelectric:, actuator or ultrasonic motor and the first moving body, and the second urging mechanism urges the second piezoelectric actuator or ultrasonic motor against the second moving body to generate an adequate frictional force between the second piezoelectric actuator or ultrasonic motor and the second moving body. Therefore, the first moving body and second moving body move at an adequate speed.

As set forth in claim 3, there is provided a stage utilizing an ultrasonic motor according to claim 1, characterized in that at least either said first ultrasonic motor or said second ultrasonic motor comprises an elastic body and a piezoelectric element for generating a first bending oscillatory wave and a second bending oscillatory wave having a phase shifted from that of said bending oscillatory wave at the elastic body; elliptical oscillation is generated the elastic body by the first bending oscillatory wave and second bending oscillatory wave; and a frictional force is applied to the moving body based on the elliptical oscillation.

The above-described means may comprise any of an elastic body and the like provided only in the first piezoelectric actuator or ultrasonic motor, an elastic body and the like provided only in the second piezoelectric actuator or ultrasonic motor and elastic bodies and the like provided in the first piezoelectric actuator or ultrasonic motor and the second piezoelectric actuator or ultrasonic motor.

According to the above, the ultrasonic motor generates a first bending oscillatory wave and a second bending oscillatory wave at the elastic body with the piezoelectric element; elliptical oscillation is generated by the first bending oscillatory wave and second bending oscillatory wave; and a frictional force is applied to the moving body based on the elliptical oscillation to move the moving body in a predetermined direction.

As set forth in claim 6, there is provided a stage utilizing a piezoelectric actuator according to claim 1 characterized in that at least either said first piezoelectric actuator or said second piezoelectric actuator comprises a first piezoelectric oscillator for generating a stretching oscillatory wave and a second piezoelectric oscillator bonded to the first piezoelectric oscillator for generating a bending oscillatory wave and in that elliptical oscillation is generated -by said stretching oscillatory wave and said bending oscillatory wave to apply a frictional force to the moving body based on the elliptical oscillation.

The above-described means may comprise any of a first piezoelectric oscillator and the like provided only in the first piezoelectric actuator, a first piezoelectric oscillator and the like provided only in the second piezoelectric actuator and first piezoelectric oscillators and the like provided in the first piezoelectric,;actuator and the second piezoelectric actuator.

According to the above, the piezoelectric actuator generates elliptical oscillation resulting from a stretching oscillatory wave generated by the first piezoelectric oscillator and a bending oscillatory wave generated by the second piezoelectric oscillator to apply a frictional force to the moving body based on the elliptical oscillation.

As set forth in the claim 7 or 8, there is provided a stage utilizing an ultrasonic motor according to claim 3, characterized in that only either of said first bending oscillatory wave and said second bending oscillatory wave is generated at said elastic body or in that both of the first bending oscillatory wave and second bending oscillatory wave are generated in the same temporal phase.

According to the above, no frictional force is applied to the moving body in the moving direction and a force is applied only in a direction perpendicular to the moving direction, which leaves the moving body static in its place. Then, the moving body is moved in the moving direction using other driving methods or manually.

As set forth in claim 9, there is provided a stage utilizing an ultrasonic motor according to claim 6, characterized in that only a stretching oscillatory wave is generated by said first piezoelectric oscillator.

According to the above, only a stretching oscillatory wave is generated by said first piezoelectric oscillator; no frictional force is applied to the moving body in the moving direction and a force is applied only in a direction perpendicular to the moving direction; and the moving body is left static in its place. Then, the moving body is moved in the moving direction using other driving methods or manually.

As set forth in claim 10, there is provided a stage utilizing an ultrasonic motor characterized in that it comprises a movable moving body, a first oscillator in contact with said moving body for applying a frictional force in one direction to said moving body with composite oscillation which is a synthesis of stretching oscillation and bending oscillation and a second oscillator in contact with said moving body for applying a frictional force in another direction different from said one direction to said moving body with composite oscillation which is a synthesis of stretching oscillation and bending oscillation and in that:

said moving body can be moved on a plane comprising one direction and another direction based on a frictional force applied by at least either said first oscillator or second oscillator.

In the above-described solving means, the first and second oscillators are a type in which predetermined polarized portions are excited to generate stretching oscillation and bending oscillation and in which a contact portion undergoes an elliptical motion attributable to composite oscillation which is a synthesis of both of the oscillations. Materials for the oscillators include barium titanate, lead titanate zirconate, lithium niobate and lithium tantalate. The oscillators may be either a single-layer type or multi-layer type, and either a single or a plurality of oscillators may be put in contact with each moving body. While the one direction and the other direction may be appropriate selected, the one direction and the other direction are preferably orthogonal to each other to cause the oscillator efficiently. Further, an oscillator may be provided to move the moving body in another direction different from the one direction and the other direction.

According to the above, when an excitation signal,is input to the first oscillator, a contact portion of the first oscillator undergoes an elliptical motion resulting from composite oscillation which is a synthesis of stretching oscillation and bending oscillation to periodically apply a frictional force directly to the moving body, thereby moving the moving body in one direction. When an excitation signal is input to the second oscillator, a contact portion of the second oscillator moves the moving body in another direction different from the one direction. When an excitation signal is input to the first oscillator and second oscillator simultaneously, the first oscillator and second oscillator move the moving body in a direction which is intermediate between said one direction and the other direction, and this intermediate direction is adjusted by the magnitude of the excitation signal input to each oscillator. As a result, the moving body is movable on a plane comprising the one direction and the other direction.

That is, since each of the oscillators is put in contact with the moving body to apply a frictional force thereto directly, there is no need for providing a mechanism to transmit a driving force between the moving body and the oscillators, which makes the configuration of the apparatus simple and compact. This also eliminates back-lash and errors associated with the provision of a mechanism for transmitting a driving force.

When the input of the excitation signal is stopped, the oscillators stop in a position reached as a result of natural attenuation of oscillation and do not stop in any particular position. Therefore, the positioning accuracy of the moving body is improved.

In addition, since no electromagnetic noise is generated, it may be used in an environment where magnetization is avoided.

As set forth in claim 11, there is provided a stage utilizing an ultrasonic motor according to claim 1, characterized in that at least three of said first oscillator and second oscillator are provided in total.

For example, when three oscillators are provided, one first oscillator and two second oscillators may be provided and, alternatively, two first oscillators and one second oscillator may be provided.

According to the above, since a frictional force is applied with the moving body supported by the first and second oscillators in three or more points in total, the moving body is moved with stability.

As set forth in claim 12, there is provided a stage utilizing an ultrasonic motor according to claim 1, characterized in that when either said first oscillator or second oscillator moves said moving body, the other oscillator causes only stretching oscillation.

According to the above, while one of the oscillators is moving the moving body with compote oscillation, the other oscillator undergoes only stretching oscillation to contact the moving body periodically, which significantly reduces the time of contact between the moving body and the other oscillator. Therefore, a braking force applied to the moving body is significantly reduced.

As set forth in claim 13, there is provided a stage utilizing an ultrasonic motor according to claim 1, characterized in that at least either said first oscillator or second oscillator has a structure in which a first piezoelectric element that undergoes stretching oscillation and a second piezoelectric element that undergoes bending oscillation are integrally stacked.

According to the above, the oscillator undergoes composite oscillation of a large magnitude which is a synthesis of the stretching oscillation caused by the first piezoelectric element and the bending oscillation caused by the second piezoelectric element, which applies a greater frictional force to the moving body. The moving body is therefore moved by a great force at a high speed.

As set forth in claim 14, there is provided a stage utilizing an ultrasonic motor according to claim 1, characterized in that said second oscillator applies a frictional force having the same magnitude as that of the frictional force applied by said first oscillator to said moving body in the direction opposite to said one direction to rotate said moving body.

According to the above, a couple of forces is formed by the frictional force of the first oscillator in one direction and the frictional force of the second oscillator in another direction. Therefore, the moving body is rotated.

As set forth in claim 15, there is provided a stage utilizing an ultrasonic motor characterized in that it comprises a movable moving body and a columnar oscillator in contact with said moving body on an end face of the columnar configuration thereof, having a first polarization process portion for generating first composite oscillation which is a synthesis of stretching oscillation and bending oscillation in the radial direction and a second polarization process portion for generating second composite oscillation similar to said first composite oscillation provided along the circumferential direction thereof and in that at least either said first polarization process portion or said second polarization process portion is excited to allow said moving body to move on a plane.

Here, in addition to the columnar configuration, the columnar oscillator may have a cylindrical configuration which is a columnar configuration having a hollow in the middle thereof.

According to the above, first composite oscillation which is a synthesis of stretching oscillation and bending oscillation is generated at the columnar oscillator by inputting an excitation signal to the first polarization process portion to excite the same. This first composite oscillation causes an elliptical motion at an end face of the columnar oscillator and applies a frictional force to the moving body in one radial direction to move the moving body.

Second composite oscillation is generated at the columnar oscillator by inputting an excitation signal to the second polarization process portion to excite the same. This second composite oscillation causes an elliptical motion at the end face of the columnar oscillator and applies a frictional force to the moving body in another radial direction to move the moving body.

When an excitation signal is applied to the first polarization process portion and second polarization process portion to excite them simultaneously, the first composite oscillation and second composite oscillation are synthesized, and a frictional force is applied to the moving body in still another radial direction to move the moving body. Further, the direction of the frictional forces applied to the moving body is adjusted by adjusting the magnitude of the excitation signal applied to the first polarization process portion and second polarization process portion.

As set forth in claim 16, there is provided a stage utilizing an ultrasonic motor characterized in that it comprises a movable moving body and a columnar oscillator in contact with said moving body on an end face of the columnar configuration thereof, having a first polarization process portion for generating first bending oscillation in the circumferential direction and a second polarization process portion for generating second bending oscillation in the circumferential direction in a phase different from that of said first bending oscillation simultaneously provided along the circumferential direction thereof and in that:

a progressive wave travelling in the circumferential direction is generated at an end face of said columnar oscillator by synthesizing the first bending oscillation and second bending oscillation to rotate said moving body based on the progressive wave.

According to the above, the first polarization process portion and second polarization process portion are simultaneously excited in different phases to generate first bending oscillation and second bending oscillation at the columnar oscillator in the circumferential direction thereof. A progressive wave which is a synthesis of the first bending oscillation and second bending oscillation and which travels in the circumferential direction is generated at an end face of the columnar oscillator, and the end face of the columnar oscillator applies a frictional force to the moving body to rotate the moving body based on the progressive wave.

As set forth in claim 17, there is provided a stage utilizing an ultrasonic motor according to any of claims 1 through 5, characterized in that a DC voltage is applied to at least either of said first oscillator and second oscillator to cause a slight motion of said moving body.

According to the above, the moving body is moved slightly by applying a DC voltage to the first oscillator or second oscillator to distort the first oscillator or second oscillator statically. As a result, fine adjustment of the position of the moving body is carried out.

As set forth in claim 18, there is provided a stage utilizing an ultrasonic motor according to claim 15 or 16, characterized in that a DC voltage is applied to at least either said first polarization process portion or second; polarization process portion to cause a slight motion of said moving body.

According to the above, for example, the moving body is moved slightly by applying a DC voltage to the first polarization process portion and second polarization process portion to distort the columnar oscillator statically. As a result, fine adjustment of the position of the moving body is carried out.

As set forth in claim 19, there is provided a stage utilizing an ultrasonic motor according to any of claims 1 through 18, characterized in that a lens is provided on said moving body.

According to the above, the lens is moved along with the moving body to change the travelling direction of light.

As set forth in claim 20, there is provided a printer characterized in that it comprises a stage utilizing a piezoelectric actuator or ultrasonic motor according to claim 19 to correct any error of the optical axis of laser light.

The printer may comprise a laser printer or laser copy.

According to the above, an optical axis correction lens is moved along with the moving body of the printer to correct any error of the optical axis of laser light.

As set forth in claim 21, there is provided electronic equipment characterized in that it comprises a stage utilizing a piezoelectric actuator or ultrasonic motor according to any of claims 1 through 19.

The electronic equipment may comprise a measuring device, processing apparatus, magnetic recording apparatus or the like, and the stage is used as a moving stage of a measuring device or a moving stage for work pieces on a processing apparatus, to move magnetic recording media and for other purposes.

According to the above, there is provided electronic equipment utilizing a stage utilizing a piezoelectric actuator or ultrasonic motor.

BRIEF DESCRIPTION OF THE DRAWINGS

FIG. 13A is a diagram showing the relationship between polarization process portions to which an excitation signal is input and the moving direction of a moving plate being moved linearly, FIG. 13B is a diagram showing the relationship between polarization process portions to which an excitation signal is input and the moving direction of a moving plate being rotated.

DETAILED DESCRIPTION OF THE PREFERRED EMBODIMENTS

Modes of implementation to which the present invention is applied will now be described in detail with reference to FIGS. 1 through 14.

<Mode of Implementation 1>

Figure 1:
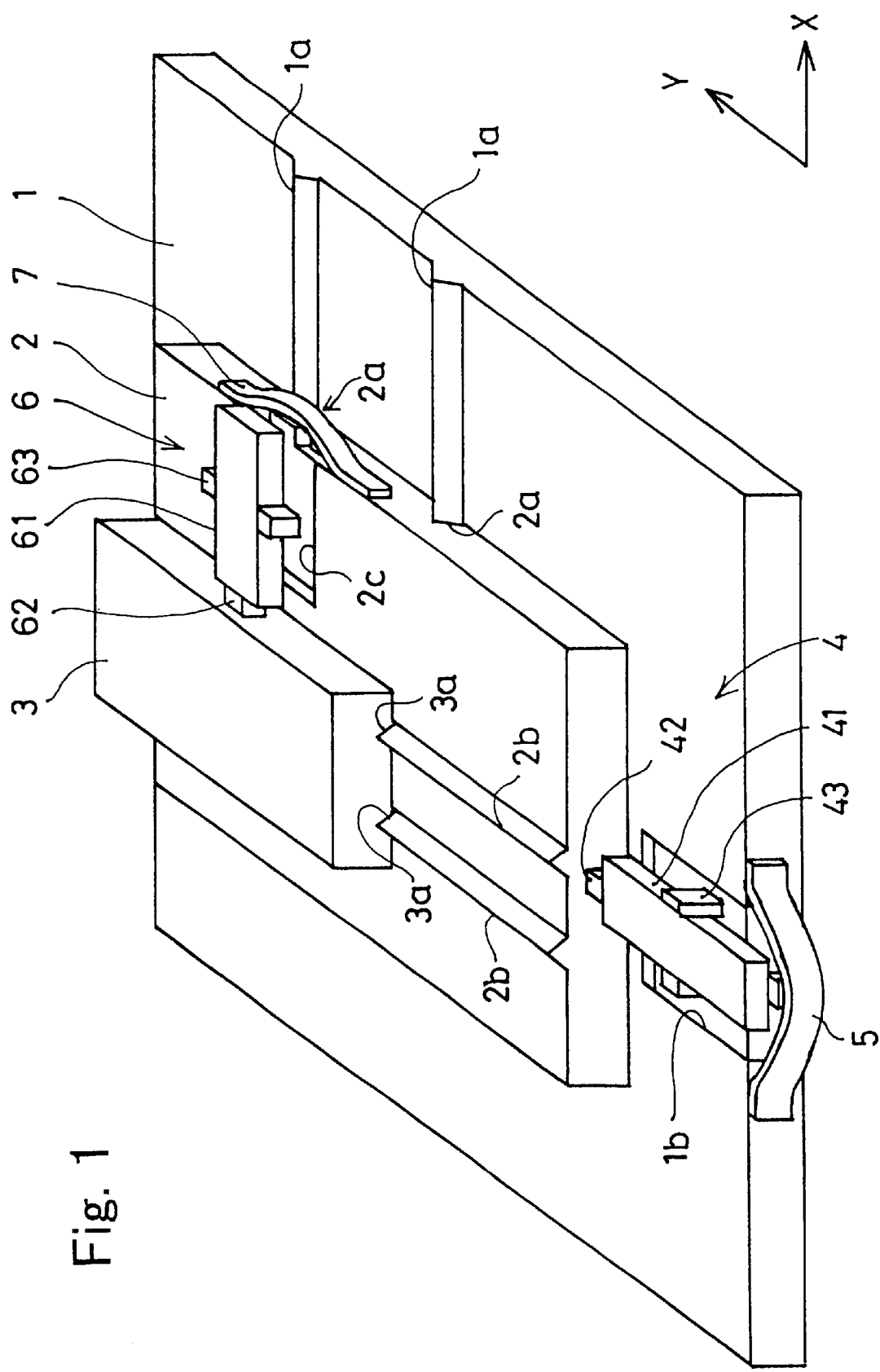
FIG. 1 is an illustration showing a stage utilizing a piezoelectric actuator according to the mode of implementation 1 to which the present invention is applied.
Figure 2A:
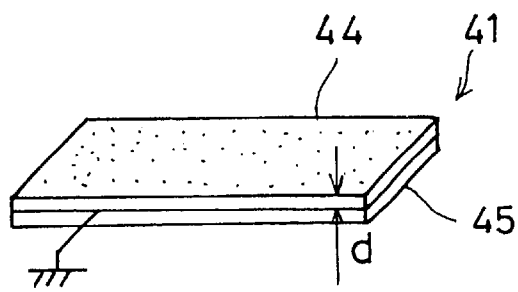
FIG. 2A is a illustration of a perspective structure of the piezoelectric oscillators showing piezoelectric oscillators of a piezoelectric actuator according to FIG. 1 and FIG. 8.
Figure 2B:
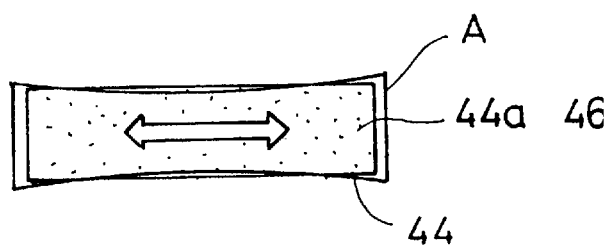
FIG. 2B is a illustration of a plan structure of a first piezoelectric oscillator showing piezoelectric oscillators of a piezoelectric actuator according to FIG. 1 and FIG. 8, and FIGS. 2C and 2D are illustrations of a structure of a second piezoelectric oscillator showing piezoelectric oscillators of a piezoelectric actuator according to FIG. 1 and FIG. 8.
Figure 2C:
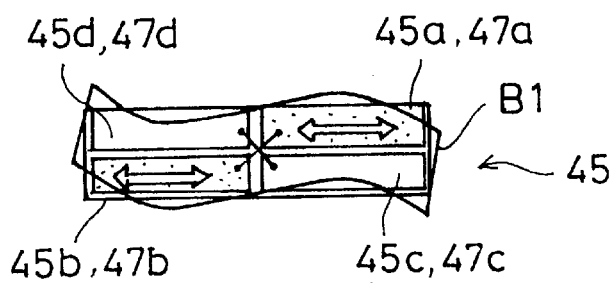
Figure 2D:
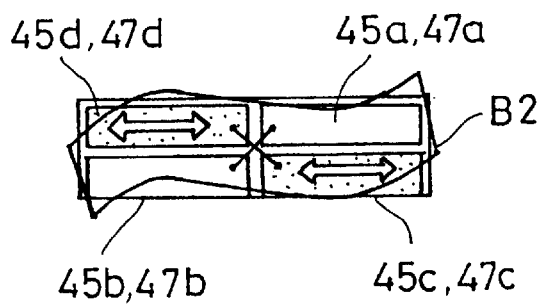
Figure 3:
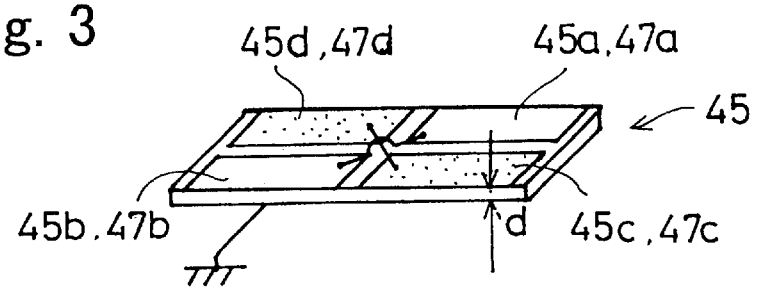
FIG. 3 is a illustration of a perspective structure of the piezoelectric oscillators showing a modification of the piezoelectric oscillators according to FIG. 1 and FIG. 8.
Figure 4:
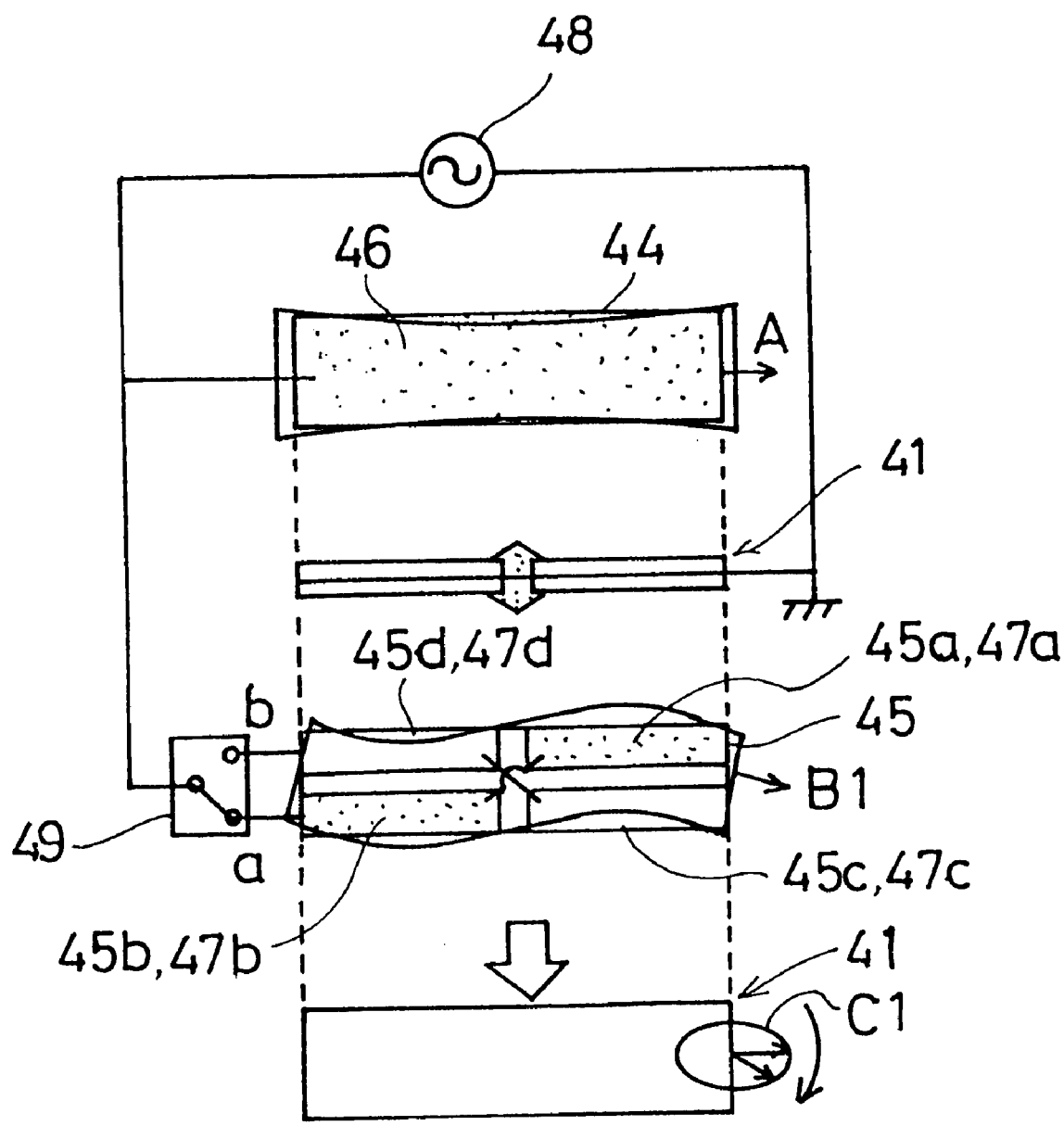
FIG. 4 is an illustration showing an example of circuit connections of the piezoelectric actuator according to FIG. 1 and FIG. 8.
Figure 5:
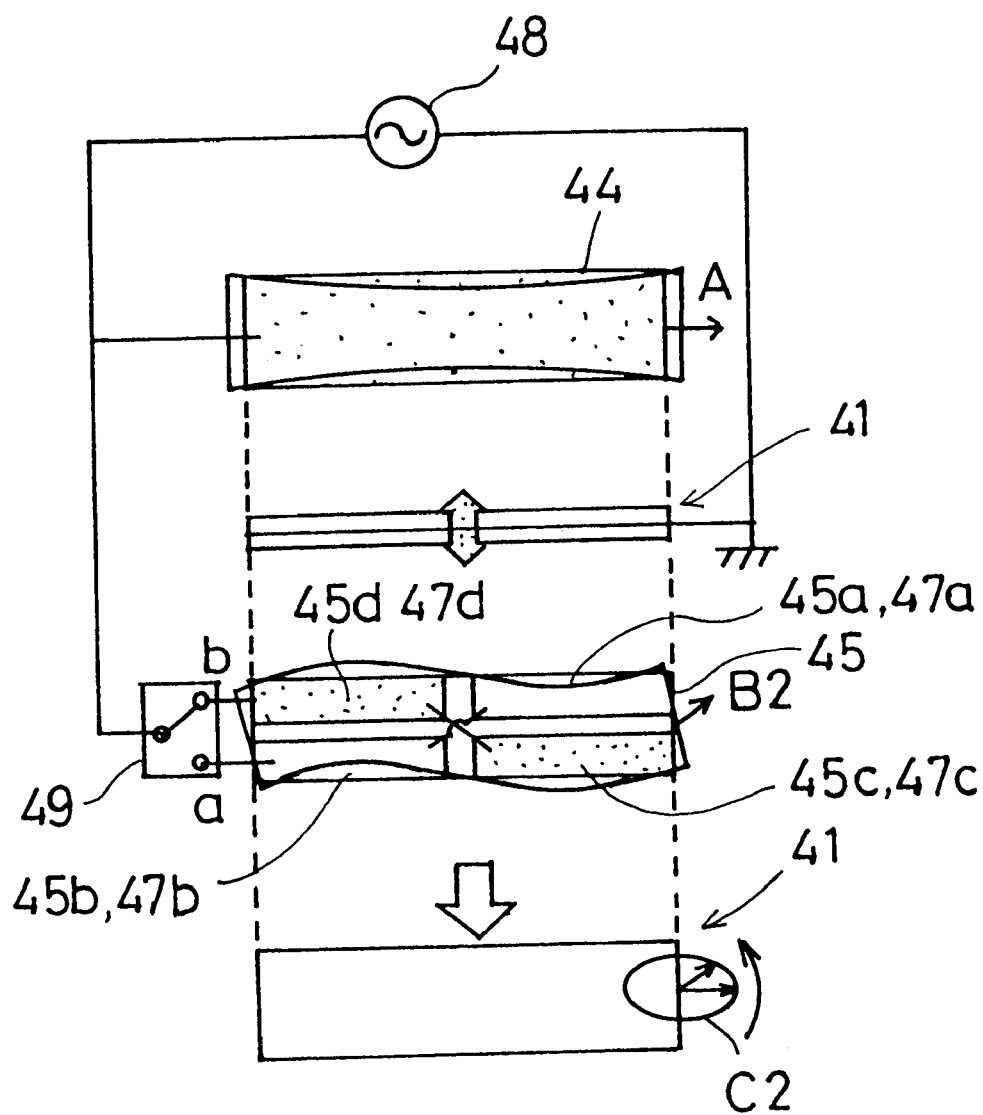
FIG. 5 is an illustration showing an example of circuit connections of the piezoelectric actuator according to FIG. 1 and FIG. 8.

FIG. 1 illustrates a stage utilizing piezoelectric actuators according to a mode of implementation 1 to which the present invention is applied. FIGS. 2A,2B,2C and 2D show piezoelectric oscillators of the piezoelectric actuators. A perspective structure of the piezoelectric oscillators is shown at FIG. 2A; a plan structure of a first piezoelectric oscillator is shown at FIG. 2B; and a structure of a second piezoelectric oscillator is shown at FIG. 2C and FIG. 2D. FIG. 3 shows a modification of the piezoelectric oscillators. A perspective structure of the piezoelectric oscillator is shown at FIG. 3. FIGS. 4 and 5 show an example of circuit connections of the piezoelectric actuator.

As shown in FIG. 1, the stage comprises a support base 1, a first moving body 2 placed on the support base 1, a second moving body 3 placed on the first moving body 2, a first piezoelectric actuator 4 in contact with a side of the first moving body 2, a first elastic member 5 urged into contact with the first piezoelectric actuator 4, a second piezoelectric actuator 6 in contact with a side of the second moving body 3 and a second elastic member 7 urged into contact with the second piezoelectric actuator 6.

The support base 1 is a rectangular body having two guide rails 1a, 1a for guiding the first moving body 2 in the X-direction in the figure provided in the middle of the upper surface thereof and having a mounting groove 1b for mounting the first ultrasonic motor 4 provided in a part of its periphery.

The first moving body 2 is a rectangular body having two guide grooves 2a, 2a associated with the guide rails 1a, 1a on the support base 1 provided on the lower surface thereof and having guide rails 2b, 2b for guiding the second moving body 3 in the Y-direction which is perpendicular to the X-direction in the figure provided on the upper surface of the rectangular body. Further, a mounting groove 2c for mounting the second ultrasonic motor 6 is provided in a part of the periphery.

The second moving body 3 is a rectangular body having two guide grooves 3a, 3a associated with the guide rails 2b, 2b on the first moving body 2 provided on the lower surface thereof.

The piezoelectric actuator 4 comprises a piezoelectric oscillator 41, an output extracting member 42 provided at an end of the piezoelectric oscillator 41 in the longitudinal direction thereof, and a support member 43 for supporting antinodes of a stretching oscillatory wave A of the piezoelectric oscillator 41 to be described later.

Specifically, as shown in FIG. 2A, the piezoelectric oscillator 41 comprises a rectangular first piezoelectric oscillator 44 and second piezoelectric oscillator 45 bonded together.

As shown at FIG. 2B, the first piezoelectric oscillator 44 is fabricated using, for example, barium titanate, lead titanate zirconate or the like. Further, a polarization process is provided on the entire surface by applying an electric field which is negative on a stacking surface thereof and positive on the surface opposite to the stacking surface; a driving electrode 46 is formed on the surface opposite to the stacking surface; and a counter electrode is formed on the stacking surface.

The first piezoelectric oscillator 44 is excited by a driving signal applied to the electrodes on both surfaces thereof to generate a stretching oscillatory wave A indicated by the bold line in the same figure.

As shown at FIG. 2C, the second piezoelectric element 45 is divided by connecting the mid points of each pairs of sides facing each other into four parts, i.e., a first polarized portion 45a, a second polarized portion 45b, a third polarized portion 45c and a fourth polarized portion 45d, and a polarization process is provided on all of the polarized portions by applying an electric field which is negative on a stacking surface thereof and positive on the surface opposite to the stacking surface.

Further, means such as deposition is applied to the surface of each of the polarized portions 45a, 45b, 45c, 45d opposite to the stacking surface thereof to form a first driving electrode 47a, a second driving electrode 47b, a third driving electrode 47c and a fourth driving electrode 47d made of, for example, gold or copper, and a counter electrode is formed on the stacking surface of the each of the polarized portions 45a, 45b, 45c, 45d. The first driving electrode 47a and second driving electrode 47b are connected by a conductive pattern or lead wire, and the third driving electrode 47c and fourth driving electrode 47d are connected by a conductive pattern or lead wire.

For example, when a driving signal is input to the first polarized portion 45a and second polarized portion 45b which are diagonal to each other, each of the polarized portions 45a and 45b is excited, and the piezoelectric oscillator 45 as a whole generates a stretching oscillatory wave B1 indicated by a solid line in the figure. When a driving signal is input to the third polarized portion 45c and fourth polarized portion 45d, the second piezoelectric oscillator 45 generates a bending oscillatory wave B2 having a phase which is 180° different from that of the bending oscillatory wave B1 as shown at FIG. 2D.

As shown in FIG. 3, the second piezoelectric oscillator 45 may be used alone as a piezoelectric oscillator. This is because not only the bending oscillatory wave B1 but also a stretching oscillatory wave is generated when the second piezoelectric oscillator 45 is excited. Therefore, the piezoelectric oscillator may be constituted only by the second piezoelectric oscillator 45 and, alternatively, each of the piezoelectric oscillators 44, 45 may be stacked to obtain higher output. Alternatively, the oscillator may have a configuration in which it is bonded to an elastic member such as a metal.

FIG. 4 and FIG. 5 are diagrams showing circuit connections of an ultrasonic motor.

As shown in FIG. 4, for example, it comprises a driving signal generation source 48 connected to the driving electrode 46 at an output terminal thereof for generating a driving signal and a switch 49 connected to another output terminal of the driving signal generation source 48 at one end thereof for switch over between the second driving electrode 47b and fourth driving electrode 47d.

The driving signal generation source 48 generates a driving signal, and the driving signal is input to the driving electrode 46 of the first piezoelectric oscillator 44 and is switched by the switch 49 to the second driving electrode 47b to be input to the second driving electrode 47b of the second piezoelectric oscillator 45.

Further, as shown in FIG. 5, the switch 49 makes switching to the fourth driving electrode 47d to input the driving signal to the driving electrode 47d.

The driving signal may be generated by forming a self-excited oscillation circuit instead of generating the driving signal using the driving signal generation source 48.

The output extracting member 42 extracts displacement as a result of transfer and increases the magnitude of elliptical oscillation which is a synthesis of the stretching oscillatory wave A and the bending oscillatory wave B1 to increase the frictional force associated with the first moving body 2.

The support member 43 supports the piezoelectric oscillator 41 at the nodes of the bending oscillatory wave B1, enters the mounting groove 1b on the support base 1 and slides therein in the Y-direction.

Like the first piezoelectric actuator 4, the second piezoelectric actuator 6 comprises a piezoelectric oscillator 61, an output extracting member 62 and a support member 63 which have the same configurations as the above-described piezoelectric oscillator 41, output extracting member 42 and support member 43, respectively. Further, it enters the mounting groove 2c and slides therein in the X-direction.

The first elastic member 5 and second elastic member 7 are constituted by, for example, flat springs. The first elastic member 5 urges the first piezoelectric actuator 4 against the first moving body 2, whereas the second elastic member 7 urges the second piezoelectric actuator 6 against the second moving body 3. As a result, an adequate frictional force is applied to the first moving body 2 and second moving body 3 to move the first moving body 2 and second moving body 3 at an adequate speed.

In the above-described configuration, since the piezoelectric actuators 4, 6 are put in contact with the moving bodies 2, 3 respectively to apply a frictional force thereto directly, there is no need for providing a mechanism for transmitting a driving force between the moving bodies 2, 3 and piezoelectric actuators 4, 6, respectively. There will be neither back-lash nor errors associated with the provision of a mechanism for transmitting a driving force. Further, no electromagnetic noise is generated because no magnetic component such as an electro-magnet is used.

A description will now be made on a method for using the stage utilizing an ultrasonic motor based on FIGS. 1, 4 and 5.

In FIG. 4, when a switch of the stage which is not shown is turned on, the driving signal generation source 48 generates driving signals in an ultrasonic band; one of the driving signals is input to the driving electrode 46 of the first piezoelectric oscillator 44; and the other driving signal is switched by the switch 49 to be input to the second driving electrode 47b.

The polarized portion 44a of the first piezoelectric oscillator 44 is excited to generate the stretching oscillatory wave A, and the first polarized portion 45a and second polarized portion 45b of the second piezoelectric oscillator 45 are excited to generate the bending oscillatory wave B1. The piezoelectric oscillator 41 generates clockwise elliptical oscillation C1 as shown in the figure as a result of the synthesis of the stretching oscillatory wave A and bending oscillatory wave B1.

The elliptical oscillation C1 is enlarged by the output extracting member 42 and is put in periodic contact with the first moving body 2 to apply a frictional force thereto.

At this time, the first elastic member 5 urges the first piezoelectric actuator 4 against the first moving body 2 to generate an adequate frictional force between the output extracting member 42 and first moving body 2. Then, the first moving body 2 is guided by the guide rails 1a, 1a at an adequate speed to be moved in the X-direction, and the second moving body 3 on the first moving body 2 is moved in the X-direction along with the first moving body 2.

The first moving body 2 can be moved in the direction opposite to the X-direction as shown in FIG. 5 by switching the switch 49 to connect the driving signal generation source 48 and the fourth polarized portion 47d. At this time, the third polarized portion 45c and fourth polarized portion 45d of the second piezoelectric oscillator 45 are excited to generate the bending oscillatory wave B2 in a phase which is 180° different from that of the bending oscillatory wave B1 at the second piezoelectric oscillator 45, thereby generating counterclockwise elliptical oscillation C2 at the piezoelectric oscillator 41, first moving body 2 and first moving body 2. The elliptical oscillation C2 is enlarged by the output extracting member 42 to move the first moving body 2 in the direction opposite to the X-direction.

Meanwhile, the second piezoelectric actuator 6 operates similarly to the first piezoelectric actuator 4 to move the second moving body 3 in the Y-direction and the direction opposite thereto.

As a result, the second moving body 3 freely moves on the X-Y plane.

For example, when the first moving body 2 is to be manually moved in the K-direction, the switch 49 may be put in a neutral state to generate the stretching oscillatory wave A only at the first piezoelectric oscillator 44 of the first ultrasonic motor 4.

At this time, the piezoelectric oscillator 41 oscillates in the longitudinal direction; the output extracting member 42 applies a force to the first moving body 2 only in a direction perpendicular to the X-direction and applies no frictional force to the first moving body 2 in the X-direction; and, as a result, the first moving body 2 will be in a floated state in which an apparent friction coefficient is reduced. Therefore, the first moving body 2 can be manually pushed to be moved in the X-direction or the opposite direction. The same effect can be achieved by applying a driving signal to all of the four polarized portions of the piezoelectric oscillator 45 to generate the stretching oscillatory wave A.

Finally, the use of the stage can be terminated by turning the switch of the stage off.

At this time, the driving signal generation source 48 stops to generate a driving signal, and the output extracting members 42, 62 of the respective ultrasonic motors 4, 6 stop as a result of natural attenuation of oscillation and are not stopped in any particular position by a magnetic force or the like.

As described above, according to the present mode of implementation, the ultrasonic motors 4, 6 are put in contact with the respective moving bodies 2, 3 to apply a frictional force thereto directly, thereby eliminating the need for providing mechanisms for transmitting a driving force between the respective moving bodies 2, 3 and ultrasonic motors 4, 6. This makes the apparatus simple and compact and eliminates back-lash and errors associated with the provision of mechanisms for transmitting a driving force.

Further, when the input of the driving signal is stopped, each of the ultrasonic motors 4, 6 stops in a position reached as a result of natural attenuation of oscillation and is not stopped in any particular position by a magnetic force or the like, which improves positioning accuracy.

Further, since no magnetic component such as an electromagnet is used to prevent the generation of electromagnetic noises, it can be used in an environment where magnetization is avoided.

In addition, since adequate frictional forces are generated between the respective ultrasonic motors 4, 6 and the respective moving bodies 2, 3 as a result of a pressure from the respective urging members 5, 7, each of the moving bodies 2, 3 is moved at an adequate speed.

Furthermore, since the elliptical oscillation C1 is generated at the piezoelectric oscillators 41, 61 by the stretching oscillatory wave A caused by the first piezoelectric oscillator 44 and the bending oscillatory wave B1 caused by the second piezoelectric oscillator 45 and the output extracting members 42, 62 which undergo the elliptical oscillation C1 cause the respective moving bodies 2, 3 to move in the X-direction and Y-direction, the second moving body 3 freely moves on the X-Y plane.

Any electrode and polarization pattern may be used on the piezoelectric oscillators without being limited to those disclosed in the present example as long as they can excite composite oscillation of stretching oscillation and bending oscillation. It is especially preferable to be able to excite stretching oscillation and bending oscillation independently.

<Mode of Implementation 2>

Figure 6:
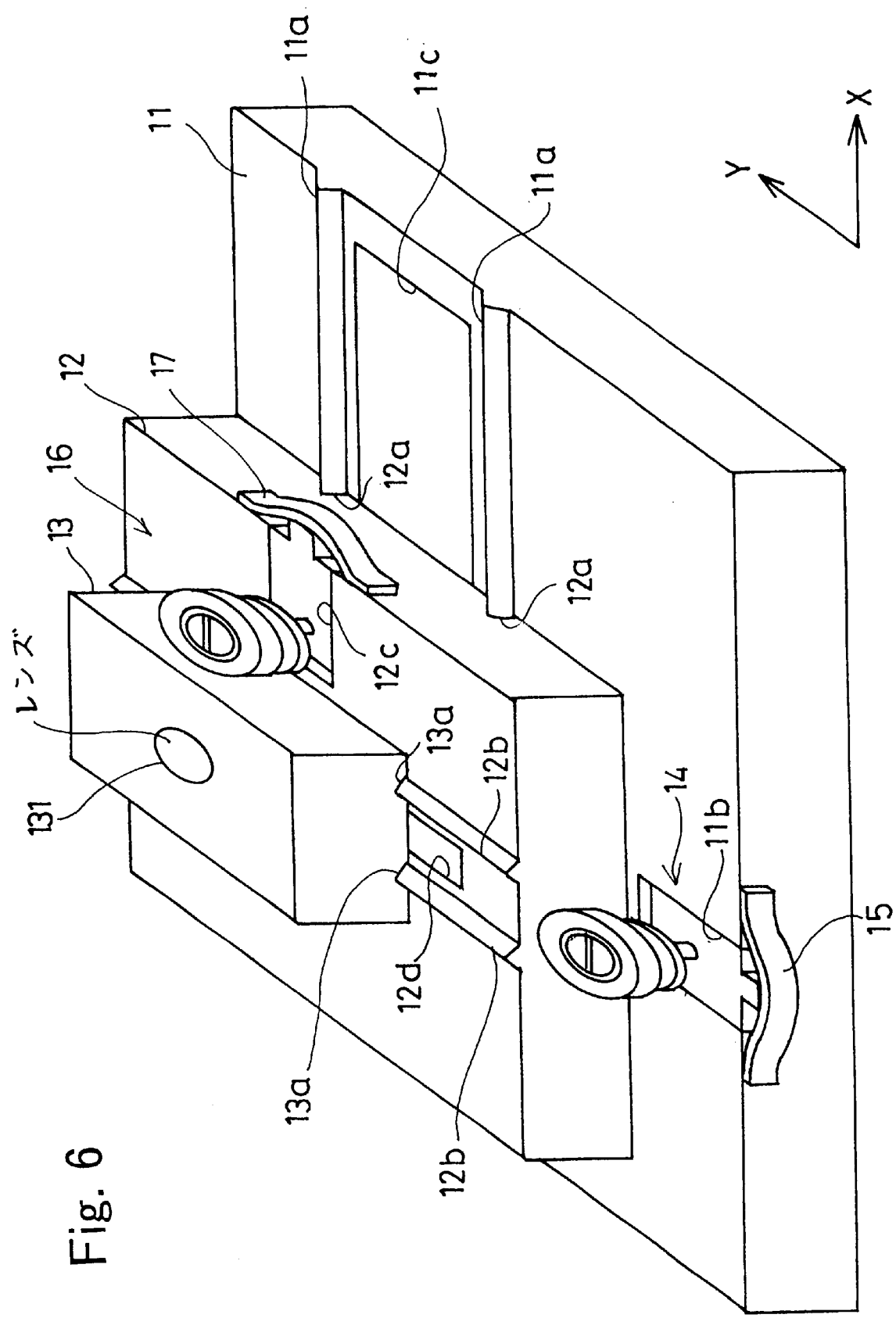
FIG. 6 is an illustration showing a perspective structure of a stage utilizing an ultrasonic motor according to the mode of implementation 2 to which the present invention is applied.
Figure 7:
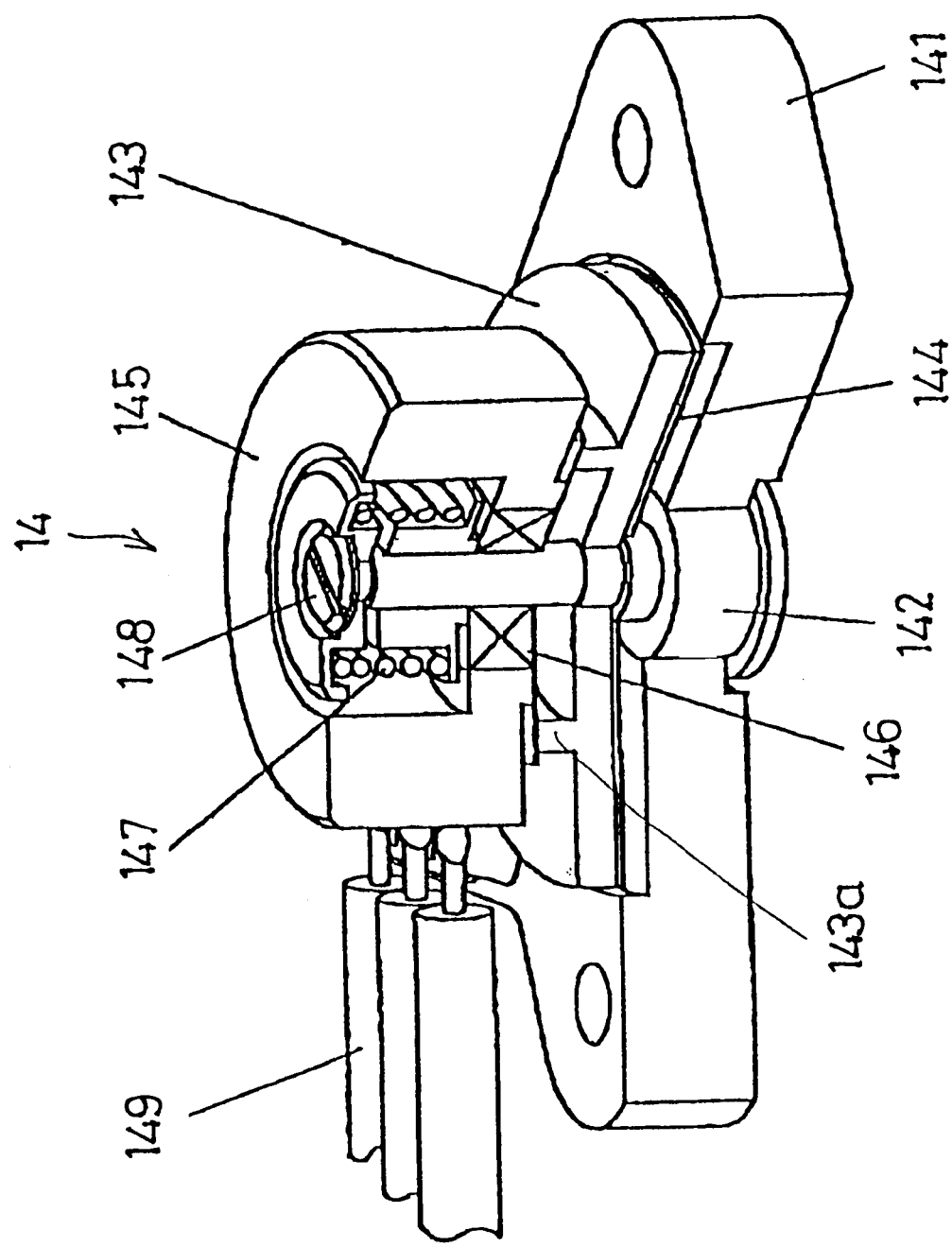
FIG. 7 is an illustration showing a structure of the ultrasonic motor according to FIG. 6 in which a part thereof is broken away.

FIG. 6 shows a perspective structure of a stage utilizing ultrasonic according to a mode of implementation 2 to which the present invention is applied. FIG. 7 shows a structure in which a part of an ultrasonic motor is broken away.

This stage comprises a support base 11, a first moving body 12 placed on the upper surface of the support base 11, a second moving body 13 placed on the upper surface of the first moving body 12, a first ultrasonic motor 14 in contact with the first moving body 12, a first elastic member 15 as a first urging mechanism according to the invention provided on the rear surface of the first ultrasonic motor 14, a second ultrasonic motor 16 in contact with the second moving body 13 and a second elastic member 17 as a second urging mechanism according to the invention provided on the rear surface of the second ultrasonic motor 16.

The support base 11 is a rectangular body having two guide rails 11a, 11a for guiding the first moving body 12 in the X-direction in the figure provided in the middle of the upper surface thereof, a mounting groove 11b for mounting the first ultrasonic motor 14 provided in a part of its periphery and a window 1c provided between the guide rails 11a, 11a.

The first moving body 12 is a rectangular body having two guide grooves 12b, 12b associated with the guide rails 11a, 11a on the support base 11 provided on the lower surface thereof and having guide rails 12b, 12b for guiding the second moving body 13 in the Y-direction which is perpendicular to the X-direction in the figure provided on the upper surface of the rectangular body. Further, a mounting groove 12c for mounting the second ultrasonic motor 16 is provided in a part of the periphery, and a window 12d is provided between the guide rails 12a, 12a.

The second moving body 13 is a rectangular body having two guide grooves 13a, 13a associated with the guide rails 12b, 12b on the first moving body 12 provided on the lower surface thereof and an optical axis correction lens 131 provided in an upper part thereof.

The optical axis correction lens 131 refracts incident light to correct any error of the optical axis of the light.

As shown in FIG. 7, the first ultrasonic motor 14 comprises a plate 141, a center shaft 142 provided in the center of the plate 141, an elastic body 143 secured to the center shaft 142, a piezoelectric element 144 bonded to the lower surface of the elastic body 143, a rotor 145 in contact with a protrusion 143a provided on the elastic body 143, a bearing 146 provided in the center of the rotor 145, a spring 147 urged into contact with the upper surface of the bearing 146, a screw 148 for stopping the spring 147 and a lead wire 149 connected to the piezoelectric element 144.

Specifically, the elastic body 143 is a disc-shaped body having the protrusion 143a on the upper surface thereof made of aluminum alloy, brass or the like.

For example, the piezoelectric element 144 is molded substantially in the form of a disc so as to correspond to the elastic body 143 using barium titanate, lead titanate, lithium niobate, lithium tantalate or the like, For example, this disc-shaped body is divided into 12 parts in the form of sectors which have a width corresponding to a ¼ wavelength of a bending oscillatory wave having 3 wavelengths in the circumferential direction, and divisions are paired at every other divisions to provide first and second polarized portions. Each of the polarized portions is processed to be alternately polarized in opposite directions in the direction of the thickness.

The first polarized portions are excited to generate a first bending oscillatory wave corresponding to 3 wavelengths in the circumferential direction of the elastic body 143, and the second polarized portions are excited to generate a second bending oscillatory wave in a phase 90° shifted from that of the first oscillatory wave. The first bending oscillatory wave and second bending oscillatory wave generate a progressive wave at the elastic body 143.

The rotor 145 is substantially constituted by a columnar body and is in contact with the first moving body 12 on a side thereof.

The second ultrasonic motor 16 has the same configuration as the ultrasonic motor 14, and the first elastic member 15 and second elastic member 17 have the same configurations as the first elastic member 5 and second elastic member 7 in the mode of implementation 1.

A description will now be made based on FIG. 6 and FIG. 7 on a method of using the stage utilizing an ultrasonic motor according to the mode of implementation 2.

Driving signals having phases shifted by 903 are supplied by the lead wire 149 to each of the first polarized portions and second polarized portions of the piezoelectric elements 144. The first polarized portions and second polarized portions are excited to generate a first bending oscillatory wave and a second bending oscillatory wave in a phase 90° shifted from the same at the elastic body 143. The first bending oscillatory wave and second bending oscillatory wave generate a progressive wave at the elastic body 143 and cause elliptical oscillation at the protrusion 143a of the elastic body 143. Meanwhile, the spring 147 urges the upper surface of the bearing 146, and the rotor 145 integral with the bearing 146 is urged into contact with the protrusion 143a of the elastic body 143. At this time, the protrusion 143a of the elastic body 143 in elliptical oscillation applies a frictional force to the rotor 145 in the circumferential direction to rotate the rotor 145 in a predetermined direction.

Meanwhile, the first elastic member 15 pushes the plate 141 to urge the side of the rotor 145 into contact with a side of the first moving body 12. At this time, a frictional force in the X-direction is generated between the side of the rotor 145 and the side of the first moving body 12, and the first moving body 12 is guided by the guide rails 11a, 11a to be moved in the X-direction.

The second ultrasonic motor 16 operates similarly to move the second moving body 13 in the Y-direction. As a result, the second moving body 13 is freely moved on the X-Y plane.

When light impinges upon the optical axis correction lens 131, the optical axis correction lens 131 moves with the second moving body 13 to refract the incident light, thereby correcting any error of the optical axis. The corrected light exits through the window 11c and window 12d.

For example, when the first moving body 12 is to be manually moved in the X-direction, it is only necessary to generate the first bending oscillatory wave at the elastic body 143 by exciting, for example, only the first polarized portions of the first ultrasonic motor 14.

At this time, the protrusion 143a of the elastic body 143 oscillates only in the direction of the thickness of the elastic body 143 and applies no frictional force to the rotor 145 in the rotating direction thereof and, as a result, the rotor 145 becomes stationary with respect to only the rotating direction and becomes unstable with respect to the direction of the thickness to result in a quite small apparent friction coefficient. Therefore, the first moving body 12 can be manually pushed to be moved in the X-direction or in the opposite direction.

Finally, the use of the stage can be terminated by stopping the supply of driving signals from the lead wire 149.

At this time, a braking force acts between the rotor 145 of each of the ultrasonic motors 14, 16 and the protrusion 143a of the elastic body 143 to keep it in a stopped state in a desired position.

As described above, according to the present mode of implementation, a first bending oscillatory wave and a second bending oscillatory wave are generated at the elastic body 143 by each piezoelectric element 144; the first bending oscillatory wave and second bending oscillatory wave cause elliptical oscillation at each elastic body 143; the protrusion 143a of each elastic body 143 in elliptical oscillation applies a frictional force to rotate each rotor 145; meanwhile, the side of each rotor 145 and the side of each of the moving bodies 12, 13 are urged into contact to generate a frictional force between each rotor 145 and each moving body; each moving body is moved in the X-direction and Y-direction by the frictional force; and, as a result, the second moving body freely moves on the X-Y plane.

Since the optical axis correction lens 131 is adapted to move with the second moving body 13 when light impinges upon the optical axis correction lens 131 to refract the light, any error of the optical axis of the light is corrected.

When one group of polarized portions is excited to generate one bending oscillatory wave at the elastic body 143, the protrusion 143a of the elastic body 143 only oscillates in the direction of the thickness of the elastic body 143 and applies no frictional force to the rotor 145 in the rotating direction thereof to put the rotor 145 in a floated state and, as a result, each of the moving bodies 12, 13 can be manually pushed to be moved along the guide rails 11a, 12b. This can be also achieved by generating two bending steady waves having the same temporal phase.

Furthermore, a braking force acts between the rotor 145 of each of the ultrasonic motors 14, 16 and the protrusion 143a of the elastic body 143 and, since this is not affected by the positions of the rotor 145 and protrusion 143a, positioning accuracy is improved.

The present mode of implementation is not limited to the progressive wave method and may be applied to a stage utilizing an ultrasonic motor based on a steady wave method. Referring to the steady wave in this case, two steady waves having positional phases shifted from each other can be generated for driving the rotor 145 in nomwl and reverse directions, and a stage similar to that described above can be configured by generating either of, the steady waves for driving and by generating both of the steady waves simultaneously for manual movement.

<Mode of Implementation 3>

Figure 8A:
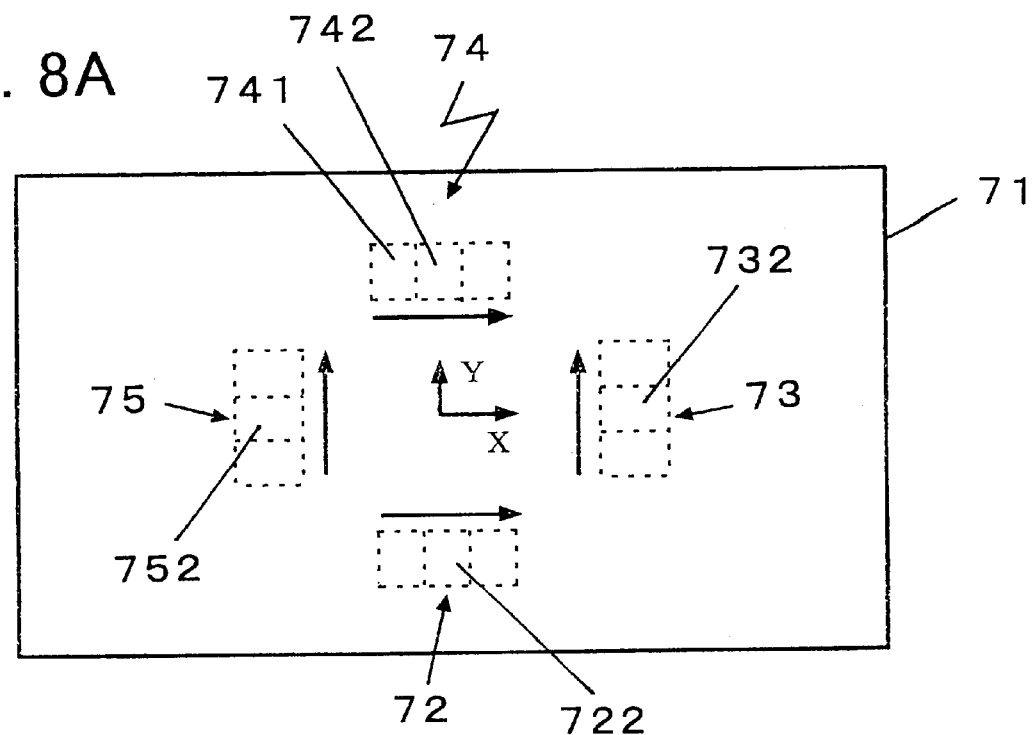
FIG. 8A is an illustration of a plan structure showing the mode of implementation 3 which is an application of the present invention to a stage utilizing an ultrasonic motor.
Figure 8B:
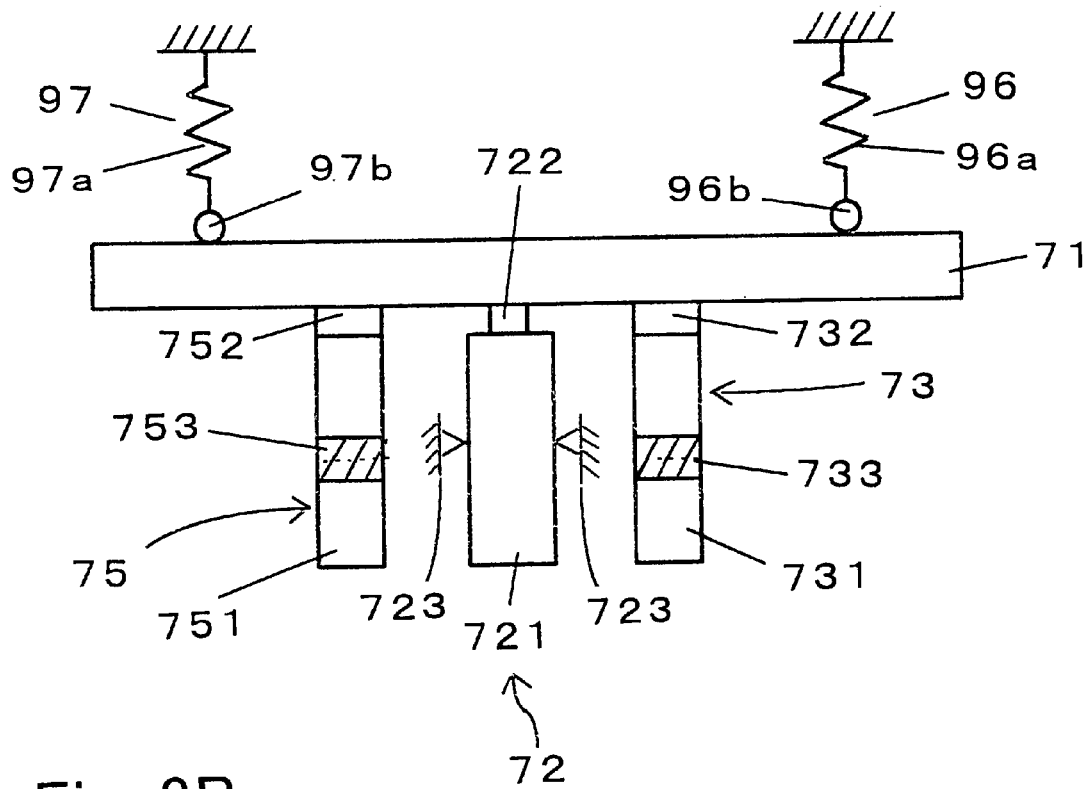
FIG. 8B is an illustration of a side structure showing the mode of implementation 3 which is an application of the present invention to a stage utilizing an ultrasonic motor.

FIGS. BA and 8B show a mode of implementation 3 which is an application of the present invention to a stage utilizing an ultrasonic motor; a plan structure is shown at FIG. 8A; and a side structure is shown at FIG. 8B. As shown in FIGS. 8A and 8B, the present mode of implementation comprises a moving plate 71 as a moving body according to the present invention, a first oscillator 72 in contact with the lower surface of the moving plate 71, a second oscillator 73 in contact with the moving plate 1 at a counterclockwise rotation ot 90° relative to the first oscillator 72, a third oscillator 74 in contact with the moving plate 1 in parallel with the first oscillator 72, a fourth oscillator 75 in contact with the moving plate 1 in parallel with the second oscillator 73 and urging mechanisms 96, 97 in contact with the upper surface of the moving plate 71. The first oscillator and second oscillator according to the present invention may be appropriately selected from among the oscillators 72, 73, 74, 75 and, for example, the first oscillator 72 is the first oscillator according to the invention; and the second oscillator 73 and fourth oscillator 75 are the second oscillator according to the invention. The third oscillator 74 corresponds to the first oscillator according to the invention when it applies a frictional force in the normal direction of the X-axis and corresponds to the second oscillator according to the invention when it applies a frictional force in the reverse direction of the X-axis.

The oscillators 72, 73, 74, 75 are similar to those described in the embodiment 1 and generate composite oscillation of stretching oscillation and bending oscillation. The principle behind the operation of the oscillators is omitted in the following.

The moving plate 71 is a rectangular flat plate made of a rigid material.

The first oscillator 72 comprises an oscillator main body 721, a protrusion 722 for enlarging oscillation secured to an end of the oscillator main body 721 and urging members 723, 723 urging and holding positions of the oscillator main body 721 which correspond to nodes of bending oscillation.

For example, when stretching oscillation A and bending oscillation fl are excited at the oscillator main body 721, composite oscillation thereof causes elliptical motion at the protrusion 722 of the first oscillator 72 which in turn periodically contacts the moving plate 71 to apply a frictional force in the direction of the arrow in FIG. 8A, thereby moving the moving plate 71.

At this time, since the protrusion 722 enlarges the elliptical motion to apply a greater frictional force to the moving plate 71, the moving plate 71 is moved at a higher speed.

Meanwhile, when bending oscillation 82 having a phase 180° shifted from that of the stretching oscillation A and bending oscillation B1 is synthesized at the oscillator main body 721, the protrusion 722 makes an elliptical motion in rotation opposite to the above-described elliptical motion to move the moving plate 71 in the reverse direction.

The second oscillator 73, third oscillator 74 and fourth oscillator 75 comprise oscillator main bodies 731, 741, 751, protrusions 732, 742, 752 similar to those of the first oscillator 72 and support members 733, 753 and, when an excitation signal is input in the same way as for the first oscillator 72, each of the oscillators 73, 74, 75 applies a frictional force in the direction of the arrow in FIG. 8A or in the opposite direction to move the moving plate 71 in the same direction. Since a frictional force is thus applied to the moving plate 71 while supporting it at four points, i.e., the oscillators 72, 73, 74, 75, it is moved with stability.

The urging mechanisms 96, 97 comprise elastic members 96a, 97a and spherical spherical bodies 96b, 97b secured to ends of the elastic members 96a, 97a. The elastic members 96a, 97a comprise a coil spring, flat spring, rubber or the like. They urge the moving plate 71 against each of the oscillators 72, 73, 74, 75.

With the configuration as described above, since each of the oscillators 72, 73, 74, 75 is put in contact with the moving plate 71 to apply a frictional force thereto directly, there is no need for providing mechanisms for transmitting a driving force between the moving plate 71 and the oscillators 72, 73, 74, 75. Further, there will be neither back-lash nor errors associated with the provision of mechanisms for transmitting a driving force.

Further, when the input of the excitation signal is stopped, the oscillators 72, 73, 74, 75 stop in a position reached by natural attenuation of oscillation and do not stop in any particular position.

Furthermore, since no magnetic component such as an electromagnet is used, no electromagnetic noise is generated.

A description will now be made based on FIGS. 8A and 8B on a method of using the stage utilizing an ultrasonic motor.

First, when the moving plate 71 is moved in the normal direction of the X-axis in FIG. 8A, the first oscillator 72 and third oscillator 74 undergo stretching oscillation and bending oscillation, thereby causing composite oscillation. The protrusions 722, 742 undergo clockwise elliptical motion to apply a frictional force in the direction of the arrow in the same figure, thereby moving the moving plate 71 in the normal direction of the X-axis.

Here, the second oscillator 73 and fourth oscillator 75 undergo only stretching oscillation, and the protrusions 732, 752 periodically contact the moving plate 71. Therefore, the braking force is significantly reduced compared to a case wherein the second oscillator 73 and fourth oscillator 75 are stopped to put the protrusions 732, 752 in continual contact with the moving plate 71.

When the moving plate 71 is moved in the reverse direction of the X-axis, the protrusion 722 of the first oscillator 72 and the protrusion 742 of the third oscillator 74 undergo a counterclockwise elliptical motion to apply a frictional force to the moving plate 71 in the reverse direction of the X-axis, thereby moving the moving plate 71 in the same direction.

Here, the second oscillator 73 and fourth oscillator 75 undergo only stretching oscillation, and the protrusions 732, 752 periodically contact the moving plate 71. Therefore, the braking force is significantly reduced compared to a case wherein the second oscillator 73 and fourth oscillator 75 are stopped to put the protrusions 732, 752 in continual contact with the moving plate 71.

When the moving plate 71 is moved in the normal direction of the Y-axis in FIG. 8A, the second oscillator 73 and fourth oscillator 75 are excited for stretching oscillation and bending oscillation. Then, only stretching oscillation may be excited at the first oscillator 72 and fourth oscillator 75.

Next, when the moving plate 71 is moved in an intermediate direction between the normal direction of the X-axis and the normal direction of the Y-axis in FIG. 8A, the first oscillator 72 and third oscillator 74 apply a frictional force to the moving plate 71 in the normal direction of the X-axis, and the second oscillator 73 and fourth oscillator 75 apply a frictional force to the moving plate 71 in the normal direction of the Y-axis. Then, the moving plate 71 is moved in the intermediate direction between the normal direction of the X-axis and the normal direction of the Y-axis by a resultant force of each of the oscillators 72, 73, 74, 75.

Further, the intermediate direction can be adjusted by adjusting the magnitude of excitation signals input to the first oscillator 72 and the third oscillator 74 and the second oscillator 73 and the fourth oscillator 75 to vary the frictional force in the X-axis direction and the frictional force in the Y-axis direction. Further, the moving plate 71 is moved to all directions by selecting the normal direction or reverse direction for the frictional force in the X-axis direction of the first oscillator 72 and third oscillator 74 and the frictional force in the Y-axis direction of the second oscillator 73 and fourth oscillator 75.

Next, when the moving plate 71 is to be rotated, it 2is required that the first oscillator 72 apply a frictional force in the normal direction of the X-axis; the second oscillator 73 apply a frictional force in the normal direction of the Y-axis; third oscillator 74 apply a frictional force having the same magnitude as that of the first oscillator 72 in the reverse direction of the X-axis; and the fourth oscillator 75 apply a frictional force having the same magnitude as that of the second, oscillator 73 in the reverse direction of the Y-axis At this time, the frictional forces applied by the first oscillator 72 and third oscillator 74 form a couple of forces and the frictional forces applied by the second oscillator 73 and fourth oscillator 75 form a couple of forces to rotate the moving plate 71 counterclockwise.

The moving plate 71 is rotated clockwise by reversing the direction of the frictional force applied by each of the oscillators 72, 73, 74, 75.

Finally, if the moving plate 71 is slightly shifted from the target position after the movement of the moving plate 71, for example, the first oscillator 72 and third oscillator 74 may be selected and a DC voltage may be applied to, for example, the piezoelectric element of each of the oscillators 72, 74 which excites bending oscillation. At this time, the oscillators 72, 74 to which the DC voltage is applied is distorted statically, and the moving plate 71 is slightly moved in an amount corresponding to the distortion to make fine adjustment of the moving plate 71.

As described above, according to the present mode of implementation, since each of the oscillators 72, 73, 74, 75 is put in contact with the moving plate 71 to apply a frictional force thereto directly, there is no need for providing mechanisms for transmitting a driving force between the moving plate 71 and the oscillators 72, 73, 74, 75, which makes the configuration of the apparatus simple and compact.

Further, there will be neither back-lash nor errors associated with the provision of mechanisms for transmitting a driving force. When the input of the excitation signals is stopped, the oscillation of the oscillators 72, 73, 74, 75 is naturally attenuated such that they will not stop in any particular position and, as a result, the positioning accuracy of the moving plate 71 is improved.

Moreover, since no electromagnetic noise is generated, it can be used in an environment where magnetization is avoided.

Since each of the oscillators 72, 73, 74, 75 has a predetermined multi-layer structure to apply a great frictional force to the moving plate 71, the moving plate 71 is moved by a greater force at a higher speed.

Since a frictional force is applied to the moving plate 71 while supporting it at four points, i.e., the oscillators 72, 73, 74, 75, it is moved with stability.

While the oscillators 72, 74 are moving the moving plate 71, the other oscillators 73, 75 undergo only stretching oscillation, and the protrusions 732, 752 periodically contact the moving plate 71. This significantly reduces the braking force based on the other oscillators 73, 75.

After the moving plate 71 has been moved, a DC voltage is applied to the oscillators 72, 73, 74, 75 to distort the oscillators 72, 73, 74, 75 statically, thereby making fine adjustment of the moving plate 71. Thus, the fine adjustment of the position of the moving plate 71 in carried out.

Figure 9A:
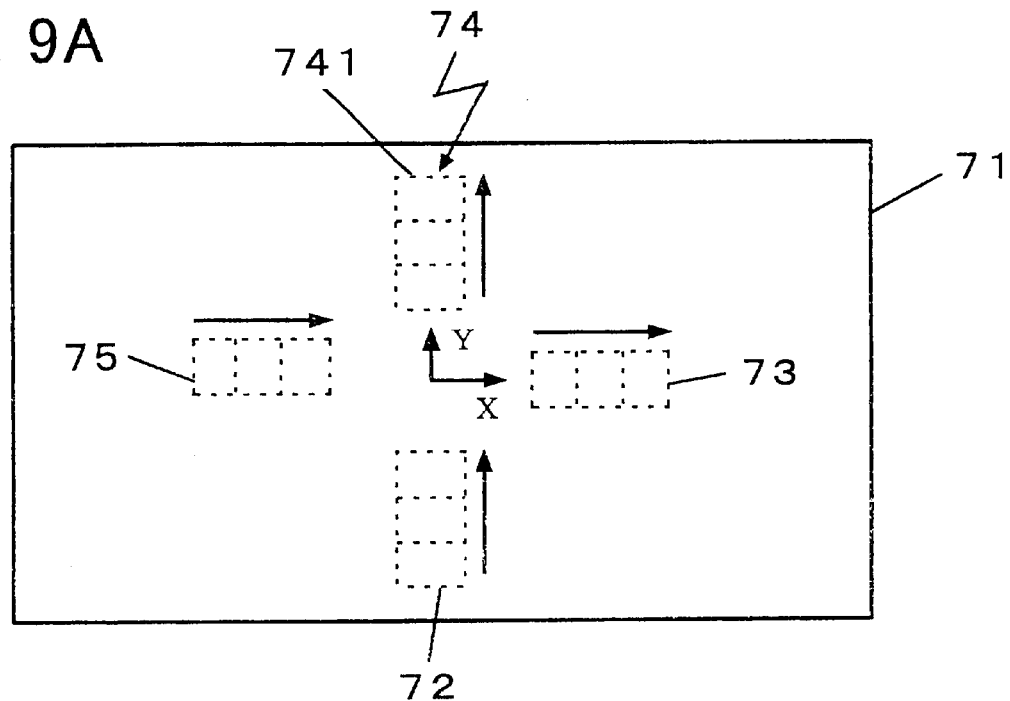
FIG. 9A is an illustration of a plan structure showing a mode of modification of the stage utilizing an ultrasonic motor according to FIG. 3.
Figure 9B:
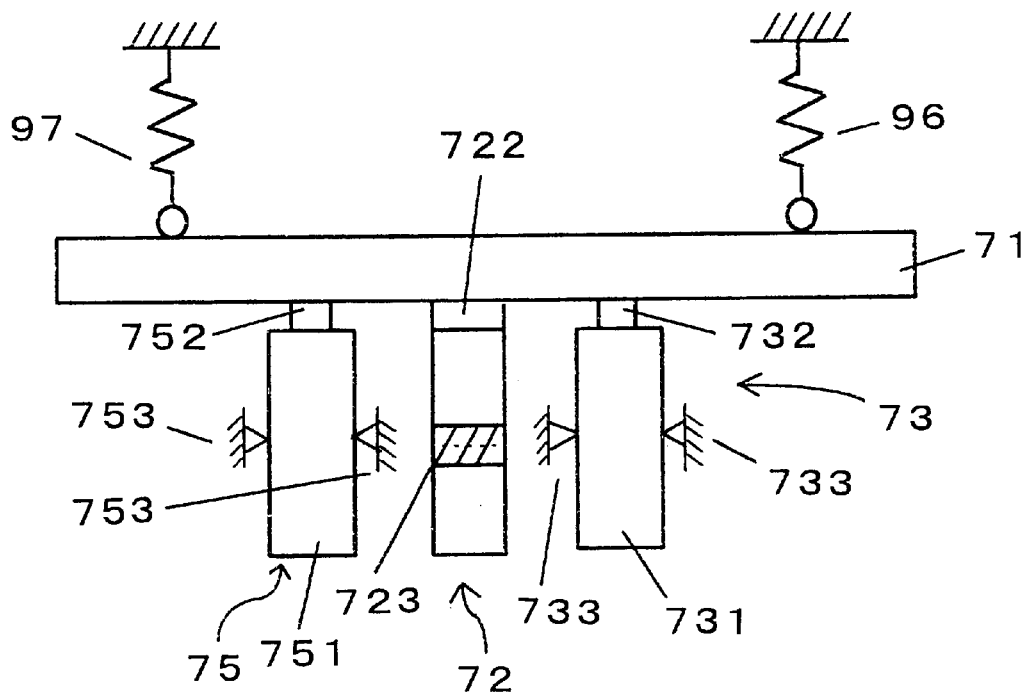
FIG. 9B is an illustration of a side structure showing a mode of modification of the stage utilizing an ultrasonic motor according to FIG. 3.

FIGS. 9A and 9B shows a mode of modification of the stage utilizing an ultrasonic motor according to the invention, shows a plan structure at FIG. 9A and shows a side structure at FIG. 9B.

The present mode of modification is characterized in that the first oscillator 72 and third oscillator 74 are arranged along the Y-axis direction and in that the second oscillator 73 and fourth oscillator 75 are arranged along the X-axis direction.

Next, a method of using this stage will be described.

First, when the moving plate 71 is to be moved in the normal direction of the Y-axis in FIG. 9A, an excitation signal is applied to the electrodes of the first oscillator 72 and third oscillator 74 to apply a frictional force to the moving plate 71 in the direction of the arrow in the same figure, thereby moving the moving plate 71 in the normal direction of the Y-axis.

When the moving plate 71 is to be moved in the normal direction of the X-axis in FIG. 9A, an excitation signal is applied to the electrodes of the second oscillator 73 and fourth oscillator 75 to apply a frictional force to the moving plate 71 in the direction of the arrow in the same figure, thereby moving the moving plate 71 in the normal direction of the X-axis.

Next, when the moving plate 71 to be moved in an intermediate direction between the normal direction of the X-axis and the normal direction of the Y-axis in FIG. 9A, the first oscillator 72 and the third oscillator 74 and the second oscillator 73 and the fourth oscillator 75 may be simultaneously oscillated under the conditions described above. At this time, the moving plate 71 is moved in the intermediate direction between the normal direction of the X-axis and the normal direction of the Y-axis by a resultant force of each of the oscillators 72, 73, 74, 7 5

As described above, the moving plate 71 is freely moved on the X-Y plane with such an arrangement of the oscillators 72, 73, 74, 75.

It is preferable here again that oscillators which do not contribute to the driving of the moving body 71 are excited only for stretching oscillation such that they will not hinder the movement of the moving body 71.

Any electrode and polarization pattern may be used on the piezoelectric oscillators without being limited to those disclosed in the present example as long as they can excite composite oscillation of stretching oscillation and bending oscillation. It is especially preferable to be able to excite stretching oscillation and bending oscillation independently.

<Mode of Implementation 4>

Figure 10A:
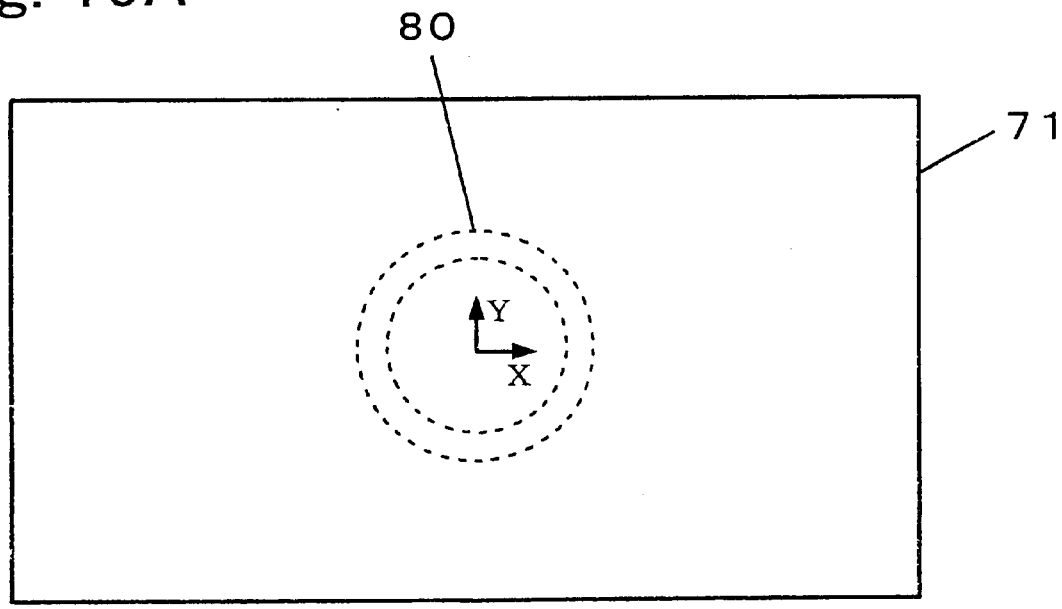
FIG. 10A is an illustration of a plan structure showing the mode of implementation 4 which is an application of the present invention to a stage utilizing, an ultrasonic motor.
Figure 10B:
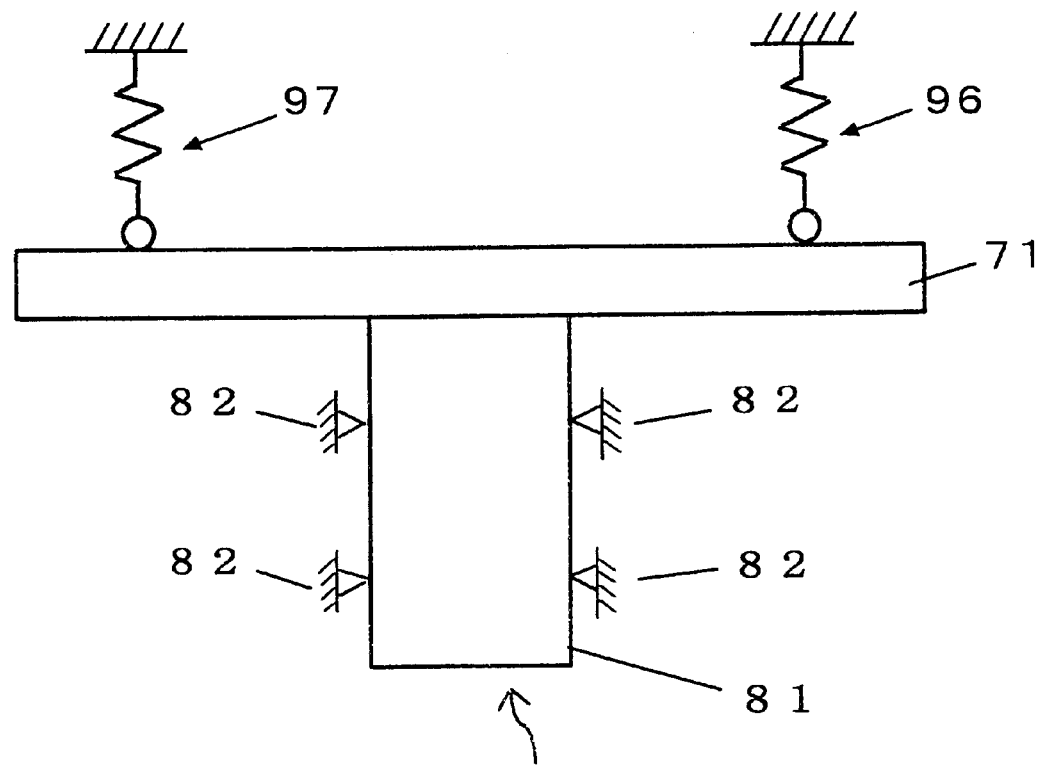
FIG. 10B is an illustration of a side structure showing the mode of implementation 4 which is an application of the present invention to a stage utilizing an ultrasonic motor.
Figure 11A:
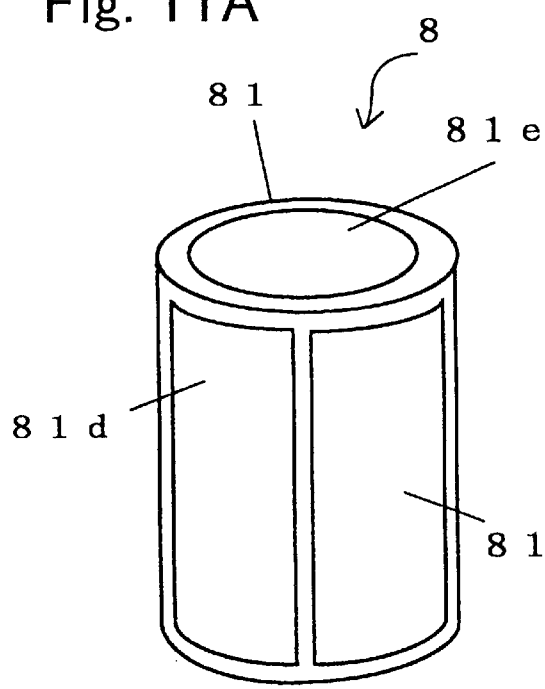
FIG. 11A is an illustration of a structure as observed diagonally showing structures of the columnar oscillator according to FIGS. 10A and 10B.
Figure 11B:
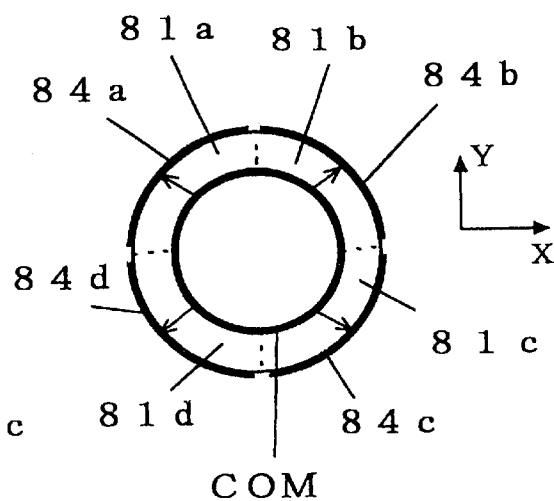
FIG. 11B is an illustration of a plan structure showing structures of the columnar oscillator according to FIGS. 10A and 10B.

FIGS. 10A and 10B show a mode of implementation 4 which is an application of the present invention to a stage utilizing an ultrasonic motor, showing a plan structure at FIG. 10A and showing a side structure at FIG. 10B. FIGS. 11A and 11B show a structure of a columnar oscillator 80 associated with the stage, showing the structure as viewed diagonally at FIG. 11A and showing a plan structure at FIG. 11B.

The present mode has a configuration which is substantially the same as that of the mode of implementation 3 and is characterized in that an end face of the columnar oscillator 80 is in contact with the moving plate 71. The description will be omitted where the configuration is identical to that of the mode of implementation 3.

The columnar oscillator 80 comprises an oscillator main body 81 and urging members 82, 82, 82, 82 for laterally urging and holding the oscillator main body 81.

The oscillator main body 81 is in the form of a cylinder which is a columnar configuration having a hollow therein and is equally divided into four parts in the circumferential direction as shown in FIG. 11B to provide a first polarization process portion 81a, a second polarization process portion 81b, a third polarization process portion 81c and a fourth polarization process portion 81d, and each of the polarization process portion 81a, 81b, 81c, 81d is polarized by applying an electric field which is positive on the inner circumferential surface and negative on the outer circumferential surface as indicated by the direction of the arrow in the figure. Further, a common electrode 83 is formed on the inner circumferential surface of the oscillator main body 81, and electrodes 84a, 84b, 84c, 84d are formed on the outer circumferential surfaces of the polarization process portions 81a, 81b, 81c, 81d, respectively.

The first polarization process portion and second polarization process portion according to the present invention may be appropriately selected from among the polarization process portions 81a, 81b, 81c, 81d and, for example, if the first polarization process portion 81a is the first polarization process portion according to the invention, any of the second polarization process portion 81b, third polarization process portion 81c and fourth polarization process portion 81d corresponds to the second polarization process portion according to the invention.

Next, a method of using this stage will be described based on FIG. 10A, FIGS. 12A, 12B and 12C and FIGS. 13A and 13B.

Figure 12A:
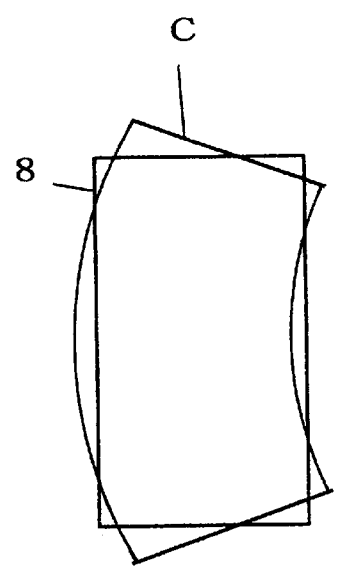
FIGS. 12A, 12B and 12C are illustrations showing an operation of the columnar oscillator according to FIGS. 11A and 11B to move a moving body linearly.
Figure 12B:
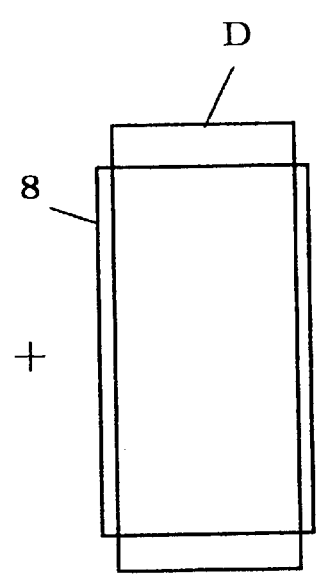
Figure 12C:
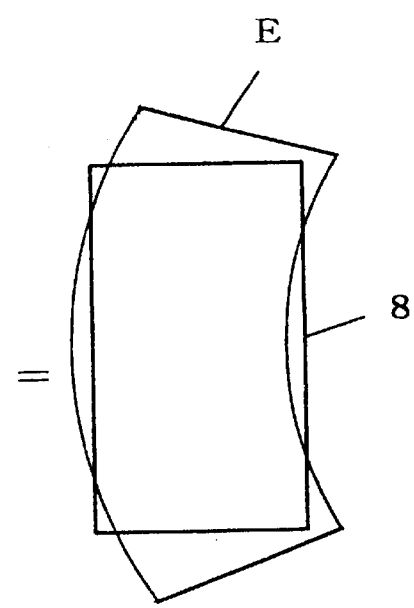

FIGS. 12A, 12B and 12C show an operation of the columnar oscillator 80 to cause linear movement of the moving plate 71, and FIGS. 13A and 13B are diagrams showing the relationship between a polarization process portion to which an excitation signal is input and the moving direction of the moving plate 71. A case wherein the moving plate 71 is linearly moved is shown at FIG. 13A, and a case wherein the moving plate 71 is rotated is shown at FIG. 13B.

First, to move the moving plate 1 in a radial direction at 315° counterclockwise relative to the normal direction of the X-axis, an excitation signal V0=Asinωt may be input to the first polarization process portion 81a to excite the first polarization process portion 81a.

At this time, the columnar oscillator 80 as a whole undergoes composite oscillation E shown in FIG. 12C resulting from bending oscillation C in the radial direction shown in FIG. 12A and stretching oscillation D shown in FIG. 12B. The upper end face of the columnar oscillator 80 applies a frictional force to the moving plate 71 in the above-described radial direction at 315° to move the moving plate 71 in the same direction.

Similarly, second, third and fourth composite oscillation may be generated by inputting the excitation signal V0 to the second polarization process portion 81b to move the moving plate 71 in a radial direction at 225°, inputting the excitation signal V0 to the third polarization process portion 81c to move the moving plate 71 in a radial direction at 135° and inputting the excitation signal V0 to the fourth polarization process portion 81d to move the moving plate 71 in a radial direction at 45°.

The moving plate 71 can be moved in a radial direction at 0° to the X-axis by inputting the excitation signal V0 to the first polarization process portion 81a and fourth polarization process portion 81d. At this time, the columnar oscillator 80 undergoes oscillation which is a synthesis of first composite oscillation based on the excitation of the first polarization process portion 81a and fourth composite oscillation based on the excitation of the fourth polarization process portion 81d to apply a frictional force to the moving plate 71 in the radial direction at 0° to the X-axis, thereby moving the moving plate 71 in the same direction.

Similarly, when the excitation signal V0 is input to the second polarization process portion 81b and third polarization process portion 81c, the moving plate 71 is moved in a radial direction at 180° to the X-axis. When the excitation signal V0 is input to the third polarization process portion 81c and fourth polarization process portion 81d, the moving plate 71 is moved in a radial direction at 90° to the X-axis. When the excitation signal V0 is input to the first polarization process portion 81a and second polarization process portion 81b, the moving plate 71 is moved in a radial direction at 270° to the X-axis.

The moving plate 71 can be rotated clockwise by inputting a first excitation signal V0=Asinωt to the first polarization process portion 81a and a second excitation signal V1=Asin(ωt+ψ) to the second polarization process portion 81b. Here, while ψ may be appropriately chosen from the range from 0° to 180°, for example, 90° is chosen to generate an idealistic progressive wave.

At this time, a counterclockwise progressive wave is generated at the upper end face of the columnar oscillator 80 by first bending oscillation in the circumferential direction based on the excitation of the first polarization process portion 81a and second bending oscillation in the circumferential direction based on the excitation of the polarization process portion 81b having a phase different from that of the first bending oscillation, whereas the mass point of the upper end face undergoes a clockwise elliptical motion to apply a frictional force to the moving plate 71 in the circumferential direction thereby rotating the moving plate 71 clockwise.

Further, by inputting an excitation signal −V0 to the third polarization process portion 81c and an excitation signal −V1 to the fourth polarization process portion 81d, stretching oscillations based on the first and second polarization process portions 81a, 81b are cancelled to provide a progressive wave having a constant height, thereby rotating the moving plate 71 smoothly.

Similarly, the moving plate 71 is rotated clockwise when the first excitation signal V0 is input to the second polarization process portion 81b and the excitation signal V1 is input to the third polarization process portion 81c, when the first excitation signal V0 is input to the third polarization process portion 81c and the excitation signal V1 is input to the fourth polarization process portion 81d, and when the first excitation signal V0 is input to the fourth polarization process portion 81d and the excitation signal V1 is input to the first polarization process portion 81a.

Further, the moving plate 71 can be rotated counterclockwise by inputting the excitation signal V1 to the first polarization process portion 81a nd the excitation signal V0 to the second polarization process portion 81b.

At this time, a clockwise progressive wave is generated at the upper end face of the columnar oscillator 80 by second bending oscillation in the circumferential direction based on the excitation of the first polarization process portion 81a and first bending oscillation in the circumferential direction based on the excitation of the second polarization process portion 81b, whereas each mass point of the upper end face undergoes a counterclockwise elliptical motion to apply a frictional force to the moving plate 1 thereby rotating the moving plate 1 counterclockwise.

Similarly, the moving plate 71 is rotated counterclockwise when the excitation signal V1 is input to the second polarization process portion 81b and the excitation signal V0 is input to the third polarization process portion 81c, when the excitation signal V1 is input to the third polarization process portion 81c and the excitation signal V0 is input to the fourth polarization process portion 81d, and when the excitation signal V1 is input to the fourth polarization process portion 81d and the excitation signal V0 is input to the first polarization process portion 81a.

As described above, the present mode of implementation not only provides the same effects as those of the mode of implementation 3 but also moves the moving plate 71 in one radial direction with first composite oscillation, moves the moving plate 71 in another radial direction with second composite oscillation and moves the moving plate 71 in still another radial direction by synthesizing the first composite oscillation and second composite oscillation.

Further, since a progressive wave travelling in the circumferential direction of an end face of the columnar oscillator 80 is generated by first bending oscillation and second bending oscillation in the circumferential direction and each mass point of the end face applies a frictional force resulting from an elliptical motion to the moving plate 71 in the circumferential direction, the moving plate 71 is rotated.

<Mode of Implementation 5>

Figure 14:
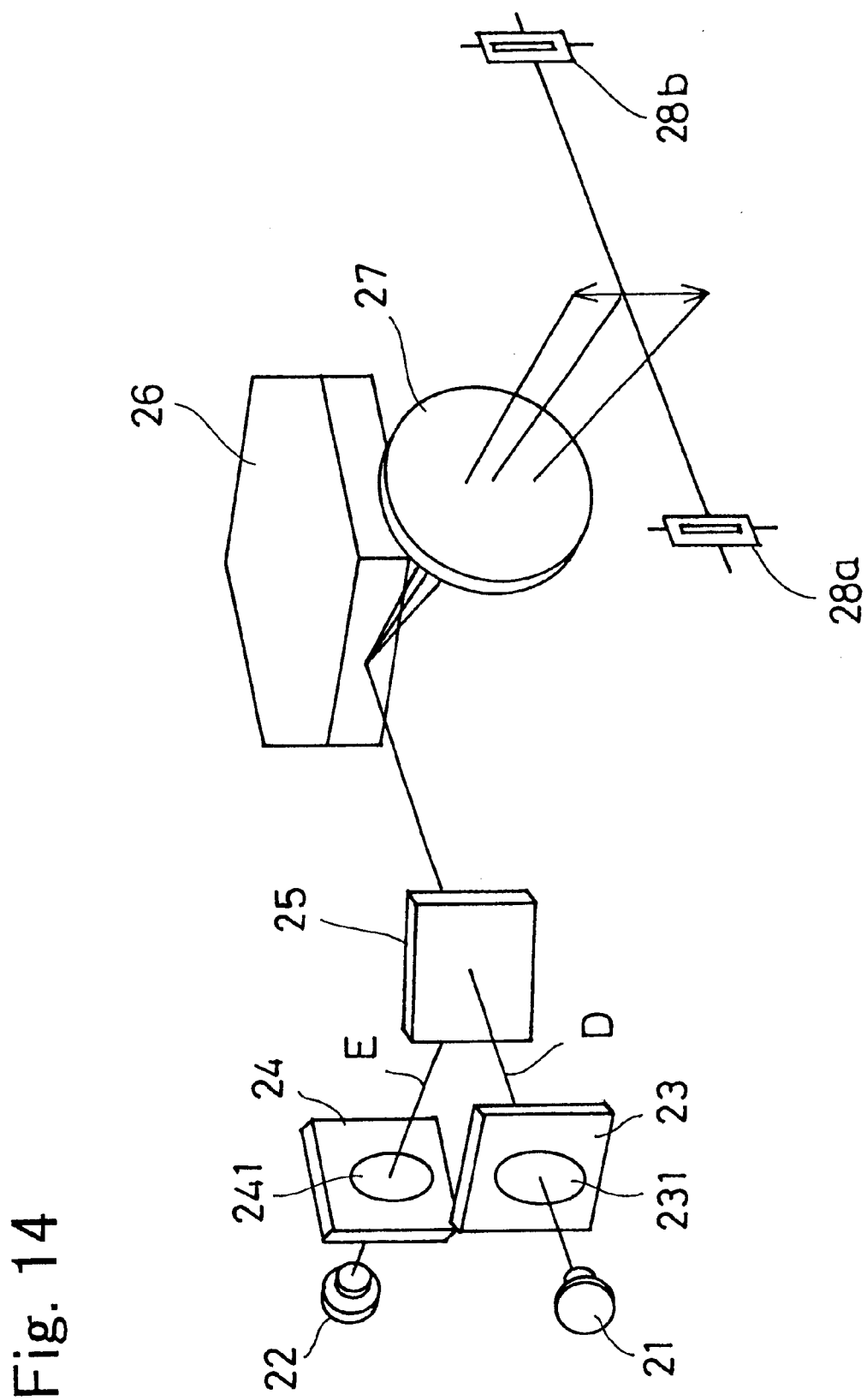
FIG. 14 is a illustration showing a major structure of a printer according to the mode of implementation 5 utilizing a stage to which the present invention is applied.

FIG. 14 illustrates a major structure of a printer utilizing stages utilizing a piezoelectric actuator or ultrasonic motor according to a mode of implementation 5 to which the present invention is applied.

The major part of the printer comprises laser beam generators 21, 22, moving stages 23, 24 as the second moving body according to the invention disposed downstream of the laser beam generators 21, 22, a half mirror 25 disposed downstream of the moving stages 23, 24, a polygon scanner 26 disposed downstream of the half mirror 25, an fθ lens 27 disposed downstream of the polygon scanner 26 and detection elements 28a, 28b disposed downstream of the fθ lens 27.

The moving stages 23, 24 include cylindrical lenses 231, 241 as the optical axis correction lens according to the invention provided in the middle thereof, and the optical axes of laser beams D, E are adjusted by the optical axis correction lenses 231, 241. The cylindrical lenses 231, 241 are freely moved on a two-dimensional plane by a piezoelectric actuator or ultrasonic motor which is not shown.

Next, a method of using this printer will be described.

The laser beams D, E emitted by the laser beam generators 21, 22 pass through the cylindrical lenses 231, 241. The laser beam D passes through the half mirror 25 to impinge upon the polygon scanner 26, and the laser beam E is reflected by the half mirror 25 to impinge upon the polygon scanner 26. The laser beams D, E are reflected by the polygon scanner 26 which rotates at a constant speed to impinge upon the fθ lens 27. The laser beams D, E impinge upon a photosensitive drum which is not shown after the interval thereof in the scanning direction is made linear by the fθ lens 27 to form a latent image on the photosensitive drum.

For example, if there is any error between the optical axes of the laser beam D and laser beam E, the detection elements 28a, 28b detect the error of the optical axes and output the detection signal to a controller which is not shown. The controller generates information on the optical axis correction, and each of the moving stages 23, 24 is moved in a predetermined direction by the piezoelectric actuator or ultrasonic motor based on the information on the optical axis correction. The cylindrical lenses 231, 241 move with the moving stages 23, 24, adjust the travelling directions of the laser beams D, E and correct any error of the optical axes.

As described above, according to the present mode of implementation, since the moving stages 23, 24 having the cylindrical lenses 231, 241 provided thereon are moved by the piezoelectric actuator or ultrasonic motor, any error of the optical axes of laser beams F, G is corrected.

<Mode of Implementation 6>

The present mode is characterized in that a stage to which the present invention is applied is used in electronic equipment.

For example, the electronic equipment may be a measuring device, an apparatus for manufacturing work pieces (e.g., waters) or a magnetic recording apparatus utilizing media. The stage according to the present invention is used as a moving stage of a measuring device or as a moving stage for work pieces or for moving media for magnetic recording.

As described above, according to the present mode of implementation, there is provided electronic equipment utilizing a stage utilizing an ultrasonic motor.

As described above, according to the invention as set forth in claim 1, there is no need for providing a mechanism for transmitting a driving force between an ultrasonic motor and a moving body, which makes the configuration of an apparatus simple and compact.

Further, there will be neither back-lash nor errors associated with the provision of a mechanism for transmitting a driving force, and an ultrasonic motor can be stopped anywhere regardless of the position of a moving body because of the friction driving. This improves the positioning accuracy of a moving body.

Furthermore, since no electromagnetic noise is generated, it can be used in an environment where magnetization is avoided.

According to the invention set forth in claim 2, since an urging mechanism urges an ultrasonic motor against a moving body to generate an adequate frictional force between the ultrasonic motor and moving body, the moving body is moved at an adequate speed.

According to the invention set forth in claim 3, since a piezoelectric element generates a first bending. oscillatory wave and a second bending oscillatory wave at an elastic body and the first bending oscillatory wave and second bending oscillatory wave generate elliptical oscillation at the elastic body to apply a frictional force to a moving body, the moving body is moved in the moving direction.

According to the invention set forth in claim 4, elliptical oscillation is generated by a stretching oscillatory wave and a bending oscillatory wave, and a frictional force is applied to a moving body based on the elliptical oscillation.

According to the inventions set forth in claim 5 and claim 6, a frictional force is not applied to a moving body in the moving direction and is applied only in a direction perpendicular to the moving direction to keep the moving body stationary in its position and, therefore, the moving body is moved in the moving direction using other driving methods or manually.

According to the invention set forth in claim 7, an optical axis correction lens is moved along with a moving body to correct any error of the optical axis of light.

According to the invention set forth in claim 8, an optical axis correction lens is moved along with a moving body of a printer to correct any error of the optical axis of a laser beam.

According to the invention set forth in claim 9, there is provided electronic equipment utilizing a stage utilizing an ultrasonic motor.

According to the invention set forth in claim 10, there is no need for providing a mechanism for transmitting a driving force between a moving body and an oscillator, which makes the configuration of an apparatus simple and compact.

Further, there will be neither back-lash nor errors associated with the provision of a mechanism for transmitting a driving force and, when the input of an excitation signal is stopped, the oscillator stops in a position reached by attenuation of oscillation and does not stop in any particular position. As a result, the positioning accuracy of the moving body is improved.

Furthermore, since no electromagnetic noise is generated, it can be used in an environment where magnetization is avoided.

According to the invention set forth in claim 11, a moving body is moved with stability because a frictional force is applied to the same supported at three or more points.

According to the invention set forth in claim 12, while one oscillator is moving a moving body with composite oscillation, the time of contact between another oscillator and the moving body is significantly reduced. As a result, a braking force applied to the moving body is significantly reduced.

According to the invention set forth in claim 13, since a greater frictional force is applied to a moving body by greater composite oscillation which is a synthesis of stretching oscillation caused by a first piezoelectric element and bending oscillation caused by a second piezoelectric element, the moving body is moved at a high speed.

According to the invention set forth in claim 14, since a couple of forces is formed by a frictional force in one direction of a first oscillator and a frictional force in the opposite direction of a second oscillator, a moving body is rotated.

According to the invention set forth in claim 15, a moving body is moved in one radial direction by first composite oscillation; the moving body is moved in another radial direction by second composite oscillation; and the first composite oscillation and second composite oscillation are synthesized to move the moving body in still another radial direction.

According to the invention set forth in claim 16, a progressive wave travelling in the circumferential direction of an end face of a columnar oscillator is generated by first bending oscillation and second bending oscillation, and the end face of the columnar oscillator applies a frictional force to a moving body based on the progressive wave. Thus, the moving body is rotated.

According to the invention set forth in claim 17, since a first oscillator or a second oscillator is statically distorted to move said moving body slightly, fine adjustment of the moving body is carried out.

According to the invention set forth in claim 18, since a columnar oscillator is statically distorted to move a moving body slightly, fine adjustment of the position of the moving body is carried out.

According to the invention set forth in claim 19, a lens is moved with a moving body.

According to the invention set forth in claim 20, the optical axis of a laser of a laser printer is adjusted by moving a lens provided on a moving body.

According to the invention set forth in claim 21, there is provided electronic equipment utilizing a stage utilizing an ultrasonic motor.

What is claimed is:

1. A stage comprising: a first moving body mounted for movement in a first direction; a second moving body mounted for movement in the first direction with the first moving body and for movement in a second direction different from the first direction; a first piezoelectric actuator or ultrasonic motor for contacting and applying a frictional force to the first moving body and for moving the first moving body in the first direction; and a second piezoelectric actuator or ultrasonic motor for contacting and applying a frictional force to the second moving body and for moving the second moving body in the second direction.

2. A stage according to claim 1; further comprising a first urging mechanism for urging the first piezoelectric actuator or ultrasonic motor against the first moving body; and a second urging mechanism for urging the second piezoelectric actuator or ultrasonic motor against the second moving body.

3. A stage according to claim 1; wherein at least one of the first piezoelectric actuator or ultrasonic motor and the second piezoelectric actuator or ultrasonic motor comprises an elastic body, and a piezoelectric element for generating a first bending oscillatory wave and a second bending oscillatory wave having a phase shifted from that of the first bending oscillatory wave at the elastic body.

4. A stage according to claim 3; wherein a progressive wave is generated by a combination of the first bending oscillatory wave and the second bending oscillatory wave to drive the first or second moving body.

5. A stage according to claim 3; further comprising a plurality of protrusions disposed on the elastic body between antinodes and nodes of the first bending oscillatory wave and the second bending oscillatory wave on the elastic body for applying a driving force to the first or second moving body to drive the first or second moving body with either of the first and second bending oscillatory waves.

6. A stage according to claim 1; wherein at least one of the first piezoelectric actuator or ultrasonic motor and the second piezoelectric actuator or ultrasonic motor comprises a first piezoelectric oscillator for generating a stretching oscillatory wave; and a second piezoelectric oscillator bonded to the first piezoelectric oscillator for generating a bending oscillatory wave; wherein elliptical oscillation is generated by the stretching oscillatory wave and the bending oscillatory wave for applying a frictional force to the first or second moving body.

7. A stage according to claim 1; wherein at least one of the first piezoelectric actuator or ultrasonic motor and the second piezoelectric actuator or ultrasonic motor comprises an elastic body and a piezoelectric element for generating a first bending oscillatory wave and a second bending oscillatory wave having a phase shifted from that of the first bending oscillatory wave, only one of the first and second oscillatory waves being generated at the elastic body; and wherein a progressive wave is generated by a combination of the first bending oscillatory wave and the second bending oscillatory wave to drive the first or second moving body.

8. A stage according to claim 4; wherein the first bending oscillatory wave and the second bending oscillatory wave are generated at the elastic body in the same temporal phase.

9. A stage according to claim 6; wherein the first piezoelectric oscillator comprises a piezoelectric oscillator for generating only a stretching oscillatory wave.

10. A stage comprising: a moving body; at least one first oscillator for generating a stretching oscillatory wave and a bending oscillatory wave and disposed in contact with the moving body for applying a frictional force to the moving body in a first direction with a composite oscillation movement generated by a combination or any one of the stretching oscillatory wave and the bending oscillatory wave to move the moving body in the first direction; and at least one second oscillator for generating a stretching oscillatory wave and a bending oscillatory wave and disposed in contact with the moving body for applying a frictional force to the moving body in a second direction perpendicular to the first direction with a composite oscillation movement generated by a combination or any one of the stretching oscillatory wave and the bending oscillatory wave to move the moving body in the second direction; wherein the moving body is moved in a plane in the first and second directions when a frictional force is applied by at least one of the first oscillator and the second oscillator.

11. A stage according to claim 10; wherein the frictional force applied to the moving body by the second oscillator has the same magnitude as that of the frictional force applied by the first oscillator and is applied to the moving body in the second direction to rotate the moving body.

12. A stage according to claim 10; wherein when one of the first oscillator or the second oscillator moves the moving body, the other of the first and second oscillators generates only a stretching oscillatory wave.

13. A stage according to to claim 10; wherein at least one of the first oscillator and the second oscillator comprises a first piezoelectric element for undergoing stretching oscillation and a second piezoelectric element for undergoing bending oscillation and being integrally stacked with the first piezoelectric element.

14. A stage comprising: a moving body; and a columnar oscillator having an end surface disposed in contact with the moving body, a first polarized portion for generating a first composite oscillation comprised of a combination of stretching oscillation and bending oscillation in a radial direction of the columnar oscillator, and a second polarized portion for generating a second composite oscillation comprised of a combination of stretching oscillation and bending oscillation along a circumferential direction of the columnar oscillator; wherein when at least one of the first polarized portion and the second polarized portion is excited a progressive wave is generated by a combination of the first and second composite oscillations to move the moving body in a plane.

15. An electronic equipment comprising a stage according to claim 14.

16. A stage according to claim 1; further comprising a lens disposed on the moving body for movement therewith.

17. A printer comprising a stage according to claim 16 for correcting any error of an optical axis of laser light passing through the lens.

18. A stage according to claim 6; further comprising means for applying a DC voltage to at least one of the first oscillator and the second oscillator to cause a slight motion of the moving body.

19. A stage according to claim 10; further comprising a lens disposed on the moving body for movement therewith.

20. A printer comprising a stage according to claim 19 for correcting any error of an optical axis of laser light passing through the lens.

21. An electronic equipment comprising a stage according to claim 10.

22. A stage according to claim 14; further comprising means for applying a DC voltage to at least one of the first polarization process portion and the second polarization process portion to cause a slight motion of the moving body.

23. A stage according to claim 14; further comprising a lens disposed on the moving body for movement therewith.

24. A printer comprising a stage according to claim 23 for correcting any error of an optical axis of laser light passing through the lens.

25. A stag e comprising: a support base; a first moving body mounted on the support base for undergoing movement relative to the support base in a first direction; a second moving body mounted on the first moving body for undergoing movement relative to the first moving body and the support base in the first direction and in a second direction different from the first direction; a first piezoelectric actuator for applying a frictional force to the first moving body and for vibrationally driving the first moving body in the first direction; and a second piezoelectric actuator for applying a frictional force to the second moving body and for vibrationally driving the second moving body in the second direction.

26. In a printer having a first lens, a second lens, a first laser beam generator for generating a laser beam having an optical axis and for directing the laser beam through the first lens, a second laser beam generator for generating a laser beam having an optical axis and for directing the laser beam through the second lens, a stage according to claim 25 for supporting the first and second lenses on the first and second moving bodies, respectively, for movement therewith to correct any error in the optical axes of the laser beams generated by the first and second laser beam generators.

27. A stage according to claim 25; wherein each of the first and second piezoelectric actuators comprises a piezoelectric element for generating a first bending vibrational wave and a second bending vibrational wave having a phase shifted from that of the first bending vibrational wave; and wherein a progressive wave is generated by a combination of the first and second bending vibrational waves to respectively drive the first and second moving bodies.

28. A stage according to claim 25; wherein each of the first and second piezoelectric actuators comprises a first piezoelectric element for generating a stretching oscillatory wave, and a second piezoelectric element connected to the first piezoelectric element for generating a bending oscillatory wave; and wherein elliptical oscillation is generated by a combination of the stretching oscillatory wave and the bending oscillatory wave to respectively drive the first and second moving bodies.

29. A stage according to claim 25; further comprising a first biasing member for biasing the first piezoelectric actuator against the first moving body, and a second biasing member for biasing the second piezoelectric actuator against the second moving body.

\* \* \* \* \*